(12) United States Patent
Chen

(10) Patent No.: US 12,022,211 B1
(45) Date of Patent: Jun. 25, 2024

(54) PIXEL COLLECTION CIRCUIT, OPTICAL FLOW SENSOR, AND OPTICAL FLOW AND IMAGE INFORMATION COLLECTION SYSTEM

(71) Applicant: OmniVision Sensor Solution (Shanghai) Co., Ltd, Shanghai (CN)

(72) Inventor: Shoushun Chen, Shanghai (CN)

(73) Assignee: OMNIVISION SENSOR SOLUTION (SHANGHAI) CO., LTD, Shanghai (CN)

( * ) Notice: Subject to any disclaimer, the term of this patent is extended or adjusted under 35 U.S.C. 154(b) by 951 days.

(21) Appl. No.: 17/024,929

(22) Filed: Sep. 18, 2020

Related U.S. Application Data

(63) Continuation of application No. PCT/CN2018/088261, filed on May 24, 2018.

(30) Foreign Application Priority Data

Mar. 23, 2018 (CN) .......................... 201810247041.9

(51) Int. Cl.
| | |
|---|---|
| *H04N 5/335* | (2011.01) |
| *H04N 25/443* | (2023.01) |
| *H04N 25/71* | (2023.01) |
| *H04N 25/75* | (2023.01) |
| *H04N 25/76* | (2023.01) |
| *H04N 25/77* | (2023.01) |
| *H04N 25/78* | (2023.01) |

(52) U.S. Cl.
CPC ......... *H04N 25/443* (2023.01); *H04N 25/745* (2023.01); *H04N 25/75* (2023.01); *H04N 25/77* (2023.01); *H04N 25/7795* (2023.01); *H04N 25/78* (2023.01)

(58) Field of Classification Search
CPC ... H04N 25/7795; H04N 25/78; H04N 25/443
See application file for complete search history.

(56) References Cited

U.S. PATENT DOCUMENTS

| | | | |
|---|---|---|---|
| 2016/0109955 A1* | 4/2016 | Park ........................ | G06F 3/011 345/668 |
| 2018/0035067 A1 | 2/2018 | Tyrrell et al. | |
| 2018/0268553 A1* | 9/2018 | Chen ..................... | H04N 25/75 |
| 2021/0037202 A1* | 2/2021 | Chen ..................... | H04N 25/745 |
| 2022/0030155 A1* | 1/2022 | Chen ..................... | H04N 23/745 |

FOREIGN PATENT DOCUMENTS

| | | |
|---|---|---|
| CN | 104205169 A | 12/2014 |
| CN | 106340514 A | 1/2017 |

* cited by examiner

*Primary Examiner* — Gary C Vieaux
(74) *Attorney, Agent, or Firm* — IPRO, PLLC

(57) ABSTRACT

The present disclosure provides a pixel collection circuit which at least includes a photoelectric detection unit, an optical flow information timing trigger unit, an optical flow information timing control unit, an optical flow information timing unit and a row selection output unit. The present disclosure further provides an optical flow sensor including the pixel collection circuit, and an optical flow and image information collection system.

20 Claims, 9 Drawing Sheets

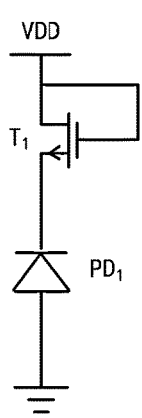
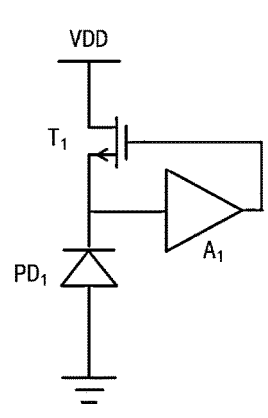
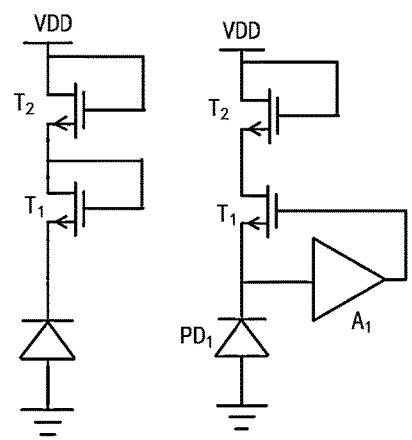
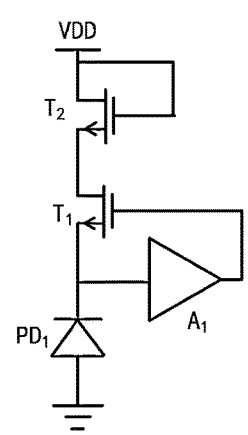
Fig. 5A     Fig. 5B     Fig. 5C     Fig. 5D
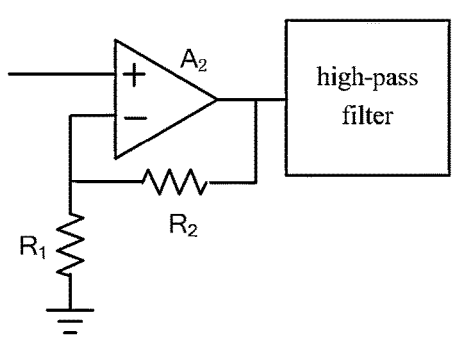
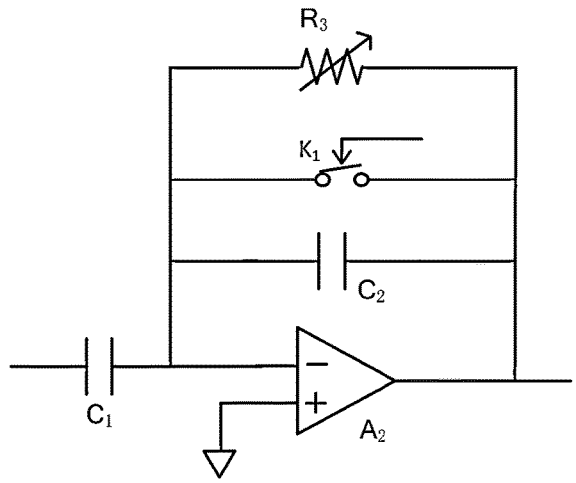
Fig.6A     Fig.6B
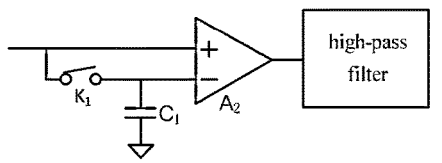
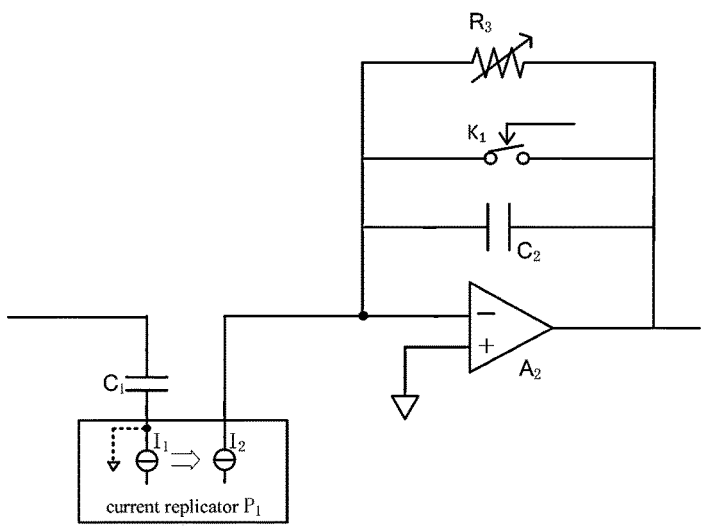
Fig.6C     Fig.6D

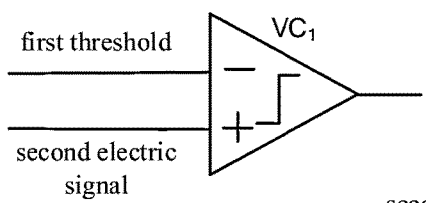
Fig. 7A
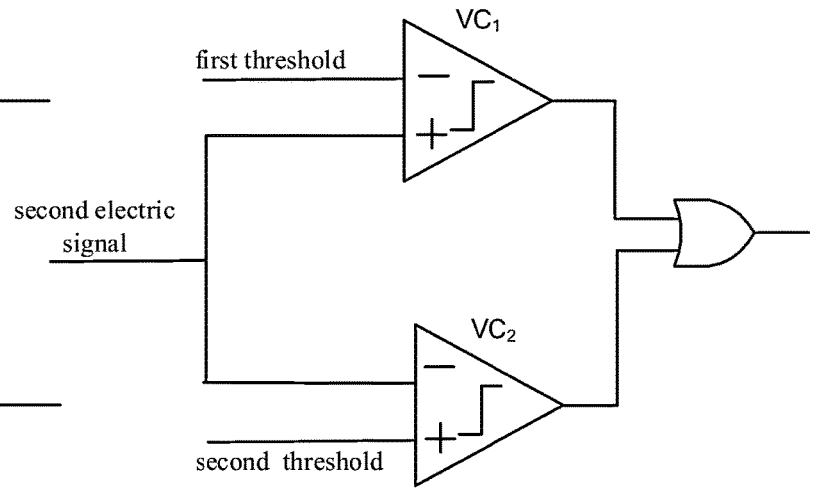
Fig. 7B
Fig. 7C
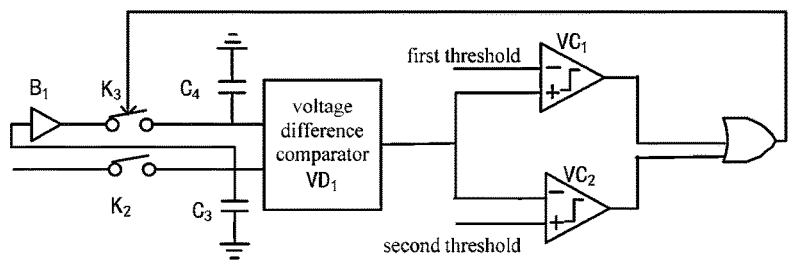
Fig.7D
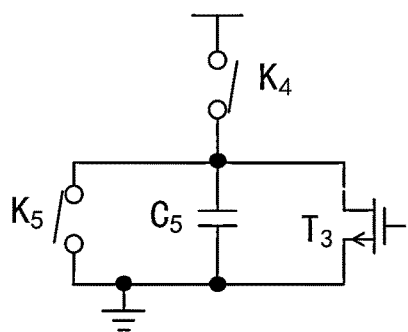
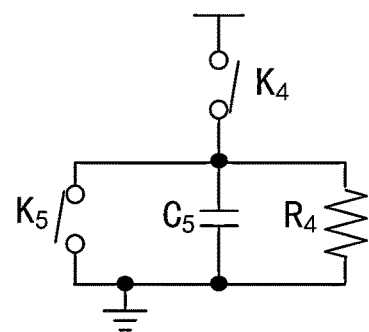
Fig.8A
Fig.8B

PIXEL COLLECTION CIRCUIT, OPTICAL FLOW SENSOR, AND OPTICAL FLOW AND IMAGE INFORMATION COLLECTION SYSTEM

TECHNICAL FIELD

The present disclosure relates to the field of image collection technology, and in particular to a pixel collection circuit, an optical flow sensor, and an optical flow and image information collection system.

BACKGROUND

With the development of the information technology, computer vision and image information processing become more and more important. For an optical flow method, the movement of a target object may be determined in accordance with image information, and this method may be applied to various fields such as military aerospace, traffic control, information science, meteorological service and medicine.

The concept of "optical flow" was originally presented by Gibson in 1950. Areal object is imaged by a photosensitive element of a camera, and points in a resultant image correspond to points on the object respectively. When a target object and a scenario in a three-dimensional space move relative to a two-dimensional image plane, a projection of the target object onto the two-dimensional image plane forms "motion". This "motion" is represented as a flowing state of an image plane brightness pattern, and the flowing state may be called as "optical flow".

At present, usually an optical flow algorithm is complex and computation-intensive. In order to calculate the optical flow, a front-end image collection device needs to collect images at a high frame rate, then a computation-intensive optical flow analysis is performed by a subsequent image processing.

The optical flow is calculated by a current optical flow sensor integrated with an active pixel sensor and an independent image information processor. For a traditional optical flow calculation method, mainly a plurality of images in a time domain is calculated to acquire motion information about a moving object. In order to perform real-time optical flow analysis on the high-speed object, the active pixel sensor needs to operate at a very high frame rate, resulting in an increase in the calculation burden of the optical flow as well as a high hardware demand on a rear-end information processor.

Hence, there is an urgent need to provide a new scheme for the collection of the optical flow and the image information.

SUMMARY

An object of the present disclosure is to provide a new optical flow collection scheme, so as to solve at least one of the above-mentioned problems.

In one aspect, the present disclosure provides in some embodiments a pixel collection circuit, including a photoelectric detection unit configured to output a first electric signal representing an intensity of a received optical signal in real time; an optical flow information timing trigger unit, a first input terminal of which is coupled to an output terminal of the photoelectric detection unit, and a second input terminal of which is coupled to an optical flow information resetting line, and which is configured to output an optical flow information timing trigger signal after a resetting signal from the optical flow information resetting line has been canceled and the first electric signal has met a preset trigger condition; an optical flow information timing control unit, a first input terminal of which is coupled to the optical flow information timing trigger unit, and a second input terminal of which is coupled to the optical flow information resetting line, and which is configured to output a timing start signal after the resetting signal from the optical flow information resetting line has been canceled and the optical flow information timing trigger signal has been received; an optical flow information timing unit, a first input terminal of which is coupled to the optical flow information timing control unit, and a second input terminal of which is coupled to the optical flow information resetting line, and which is configured to be started and generate a timing signal after the resetting signal from the optical flow information resetting line has been canceled and the timing start signal has been received; and a row selection output unit, a first input terminal of which is coupled to the optical flow information timing unit, and a second input terminal of which is coupled to an optical flow output row selection line, and which is configured to receive an optical flow row selection signal from the optical flow output row selection line, and cache and output the timing signal at a current reception time point when the optical flow row selection signal is valid.

In a possible embodiment of the present disclosure, the pixel collection circuit further includes an image information collection unit, a first input terminal of which is coupled to the output terminal of the photoelectric detection unit, and a second input terminal of which is coupled to an image information collection line, and which is configured to receive an image information collection signal from the image information collection line, and sample and cache the first electric signal at the current reception time point. A third input terminal of the row selection output unit is coupled to the image information collection unit, a fourth input terminal of the row selection output unit is coupled to an image output row selection line, and the row selection output unit is further configured to receive an image row selection signal from the image output row selection line, and cache and output the first electric signal at the current reception time point when the image row selection signal is valid.

In another aspect, the present disclosure provides in some embodiments an optical flow sensor, including: a pixel collection circuit array including a plurality of the above-mentioned pixel collection circuits; an optical flow information reading unit configured to read timing signals outputted by at least a part of the pixel collection circuits in the pixel collection circuit array; and a global control unit configured to generate the resetting signal, and output the resetting signal to each pixel collection circuit in the pixel collection circuit array through an optical flow information resetting line.

In a possible embodiment of the present disclosure, the optical flow sensor further includes an image information reading unit configured to read first electric signals outputted by at least a part of the pixel collection circuits in the pixel collection circuit array, and the global control unit is further configured to generate an image information collection signal, and output the image information collection signal to each pixel collection circuit in the pixel collection circuit array through an image information collection line.

In yet another aspect, the present disclosure provides in some embodiments an optical flow and image information collection system, including: the above-mentioned optical flow sensor; an optical flow preprocessor coupled to the optical flow information reading unit of the optical flow sensor, and configured to acquire a timing signal and generate a time-mapping image of each triggered pixel point; and an image preprocessor coupled to the image information reading unit of the optical flow sensor, and configured to acquire a first electric signal and generate a grayscale image for all pixel points.

In a word, according to the embodiments of the present disclosure, an optical flow information extraction scheme is provided so as to effectively extract the optical flow information for the moving objects at various speeds. In addition, the image information may be collected, so as to acquire a clear and non-lagging grayscale image as background information for the extracted optical flow information. The optical flow sensor may output optical flow frame information and image frame information in parallel and independently. As a result, it is able for the optical flow and image information collection system to acquire the optical flow and image information in parallel without mutual interference, and to adjust a collection speed and a reading speed of each of the optical flow information and the image information according to the practical need.

BRIEF DESCRIPTION OF THE DRAWINGS

In order to achieve the above and related objects, some descriptive aspects will be described in conjunction with the following description and drawings, and these aspects indicate various ways capable of practicing a principle of the present disclosure. All aspects and equivalent aspects thereof shall fall within the scope of the present disclosure. The above and other objects, features and advantages will become more apparent on the basis of the drawings in conjunction with the following description. Same reference signs represent a same component or element.

FIGS. 5A, 5B, 5C, and 5D are schematic views showing a photoelectric detection unit 410 according to one embodiment of the present disclosure;

FIGS. 6A, 6B, 6C, and 6D are schematic views showing a filtration and amplification module according to one embodiment of the present disclosure;

FIGS. 7A, 7B, 7C, and 7D are schematic views showing a threshold comparison module according to one embodiment of the present disclosure;

FIGS. 8A and 8B are schematic views showing an optical flow information timing unit according to one embodiment of the present disclosure;

DETAILED DESCRIPTION

The present disclosure will be described hereinafter in more details in conjunction with the drawings and embodiments. The following embodiments are for illustrative purposes only, but shall not be used to limit the scope of the present disclosure. In contrast, the following embodiments are provided so as to facilitate the understanding of the present disclosure.

Figure 1:
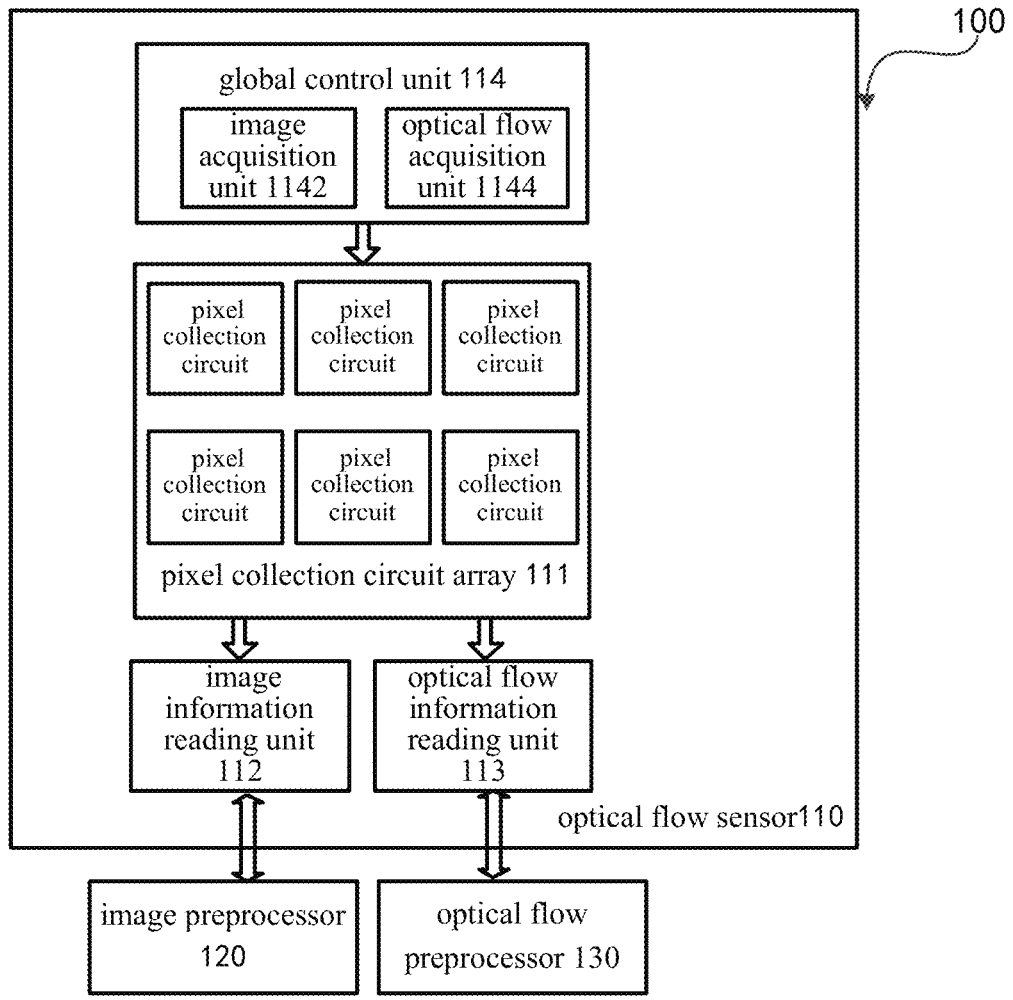
FIG. 1 is a schematic view showing an optical flow and image information collection system 100 according to one embodiment of the present disclosure.

As shown in FIG. 1, the present disclosure provides in some embodiments an optical flow and image information collection system 100, which includes an optical flow sensor 110, an image preprocessor 120 and an optical flow preprocessor 130. The optical flow sensor 110 includes a pixel collection circuit array 111 consisting of a plurality of pixel collection circuits (i.e., pixel units), an image information reading unit 112, an optical flow information reading unit 113 and a global control unit 114. Each pixel collection circuit in the array 111 is coupled to the image information reading unit 112, the optical flow information reading unit 113 and the global control unit 114 via a bus. Usually, the pixel collection circuit array 111 may include the pixel collection circuits arranged in rows, and one or more pixel collection circuits may be arranged in each row. FIG. 1 shows 6 (i.e., 3*2) pixel collection circuits, but the structure of the array may not be limited thereto. The global control unit 114 may include an image collection unit 1142 and an optical flow collection unit 1144 configured to generate a global image information collection signal and a resetting signal respectively, so as to control the entire pixel collection circuit array 111. Specifically, each pixel collection circuit in the array 111 may simultaneously acquire image information and optical flow information under the effect of a global control signal from the global control unit 114. The image information may reflect a magnitude of a light intensity perceived by the array 111 in a field of view, and the optical flow information may reflect time-space information about motion in the field of view. The two pieces of information may be transmitted to the image preprocessor 120 and the optical flow preprocessor 130 respectively under the control of the image information reading unit 112 and the optical flow information reading unit 113.

In a possible embodiment of the present disclosure, for the collection of the optical flow information, the motion in a real world may correspond to a change in the light intensity perceived by the sensor in the field of view, and the array 111 may synchronously monitor the change in the light intensity in the field of view in real time (for example, luminance variation, a change rate, etc.). Specifically, each pixel collection circuit in the array 111 may monitor light intensity information received thereby in real time. Each pixel collection circuit may enter a triggered state when the change in the light intensity information has met a preset condition (for example, when each of the luminance variation and the change rate exceeds a threshold). When the preset condition has not been met, the pixel collection circuit may be maintained in an original state. For the pixel collection circuit in the triggered state, an optical flow information timing unit in the pixel collection circuit, as a timer, may be started immediately. After the pixel collection circuit is in the triggered state, the timer may be started to generate a timing signal monotonically changing over time to represent time information. Then, the optical flow preprocessor 130 may read transient magnitudes of the timing signals (at each reading time point) from all the pixel collection circuits in the array 111 through the optical flow information reading unit 113, so as to acquire a two-dimensional time-mapping image (optical flow frame). The timing signal for each pixel point may be used to determine whether the pixel collection circuit has been triggered (by detecting whether the signal is a valid timing signal) at the reading time point and how long it has been triggered (by detecting a magnitude of the valid timing signal). When the optical flow frame has acquired enough optical flow timing information outputted by the triggered pixel unit, a mapping of the optical flow frames on a pixel array plane may be represented as a two-dimensional time slope plane. Through further analysis on the time slope plane, direction information and speed information about the motion in the field of view may be extracted, so as to calculate the optical flow. In a possible embodiment of the present disclosure, the optical flow information timing unit may be a ramp signal generator, which is started only once during one optical flow information detection process and is configured to locally generate a ramp signal linearly changing over time.

In a possible embodiment of the present disclosure, for the collection of the image information, the global control unit 114 may generate a (global) image information collection signal, which is used to control image information collection units of all the pixel collection circuits in the array 111 to simultaneously collect and cache first electric signals related to the light intensity at a current time. In a subsequent reading process, the light intensity information (image frame) of the whole image may be acquired through acquiring the first electric signal cached by each pixel collection circuit.

It should be appreciated that, the optical flow information and the image information may be acquired by the optical flow sensor 110 completely independent of each other, so that they are outputted in parallel. Firstly, the optical flow information and the image information may be simultaneously collected by the image information collection unit and the optical flow information timing unit of each pixel collection circuit in the array 111 respectively. In addition, the optical flow information and the image information may be read by the reading units respectively, and then transmitted to the preprocessors via separate data buses respectively. Hence, the optical flow sensor 110 may output the optical flow information and the image information completely in parallel without any mutual interference. An acquisition speed and a reading speed of each of the optical flow information and the image information may be adjusted according to the practical need.

According to the above description, the optical flow sensor 110 may output the optical flow information and the image information in parallel. The optical flow information reading unit 113 may scan the timing signals from the optical flow information timing units in the entire pixel collection circuitry array 111 at a certain frequency to acquire consecutive optical flow frames. Each optical flow frame may contain time information about a triggering time point of the triggered pixel collection circuit, and the optical flow information about the motion may be acquired through analyzing aspect information and gradient information about a time slope formed through mapping the time information to a two-dimensional space of the array 111. The image information reading unit 112 may scan the first electric signals acquired by the image information collection units in the entire pixel array at a certain frequency so as to acquire consecutive image frames. Each image frame may contain a grayscale image for all pixel points and related to the light intensity. The grayscale image for all pixel points in each image frame may serve as a background image for marking the optical flow information, and the optical flow information may be extracted conveniently from a time slope plane acquired in accordance with the optical flow frames.

Figure 2A:
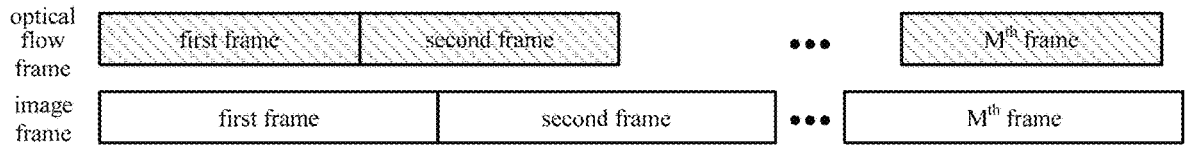
FIGS. 2A, 2B, 2C, and 2D are schematic views showing operating modes of an optical flow sensor 110 according to one embodiment of the present disclosure.
Figure 2B:
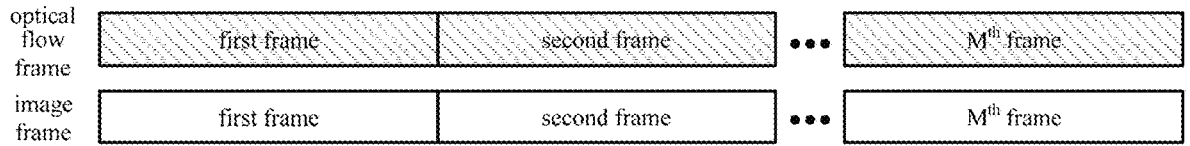
Figure 2C:
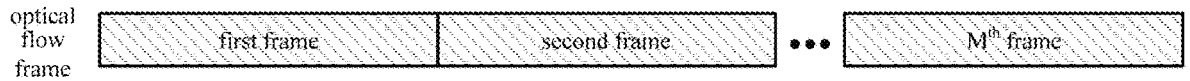
Figure 2D:
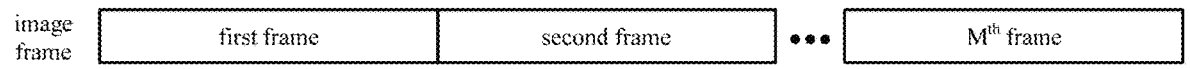

Typical operating modes of the optical flow sensor 110 will be illustratively described hereinafter in conjunction with FIGS. 2A, 2B, 2C and 2D. In FIGS. 2A, 2B, 2C and 2D, a block with slashes represents the optical flow frame, and a block without slashes represents the image frame. The optical flow sensor 110 may output the optical flow frame and the image frame in parallel. Frame rates of the optical flow frame and the image frame may be set separately according to different application scenarios, as shown in FIG. 2A, or a same frame rate may be provided, as shown in FIG. 2B. In some application scenarios, it is merely necessary to output the optical flow frames or the image frames continuously so as to detect the motion, as shown in FIGS. 2C and 2D respectively.

It should be appreciated that, for the operating modes of the optical flow sensor 110, apart from those mentioned hereinabove, some other equivalents may also be provided, which will not be particularly defined herein.

The optical flow frame and the image frame will be described hereinafter in more details.

In each optical flow information detection process, when a moving object passes through the field of view of the optical flow sensor 110, the light intensity of light received by a part of pixel collection circuits in the array 111 may change. When the change in the light intensity exceeds a threshold, a timing unit, i.e., the optical flow information collection unit, in the pixel collection circuit may be started. In a simplest way, the optical flow information collection unit may locally generate a ramp signal linearly changing over time. When there is no change in the light intensity or the change in the light intensity does not exceed the threshold, the pixel collection circuit may be maintained in a non-triggered state, and the optical flow information timing unit may not be started. Meanwhile, the optical flow information reading unit 113 may read the timing signal from the optical flow information timing unit of each pixel collection circuit in the array 111, and transmit the timing signal to the rear-end optical flow preprocessor 130. The optical flow preprocessor 130 may acquire the time-mapping image of the triggered pixel point in accordance with the timing signal. For example, the optical flow information reading unit 130 may scan the entire array 111 progressively, and transmit an amplitude of the ramp signal from each optical flow information collection unit to the external optical flow preprocessor 130. The timing signal (the ramp signal) for each pixel point may be used to determine whether the pixel point has been triggered (by detecting whether the signal is a valid timing signal) at the reading time point and how long it has been triggered (by detecting the magnitude of the valid timing signal).

The ramp signal may be subjected by the optical flow preprocessor 130 to amplification, analog-to-digital conversion and encoding operation, so as to acquire the corresponding time information from the magnitude of the ramp signal. In the optical flow information detection process, each pixel collection circuit in the array 111 may be triggered and the optical flow information timing unit may be started merely when the change in the light intensity exceeds the threshold for the first time. All the optical flow information timing units in the pixel array 111 may be scanned to acquire one optical frame, and the optical frame may contain the space information about each of the triggered pixel units and the time information about the triggering time point of the triggered pixel unit at a current scanning time point. A first optical frame is outputted at an initial time point in the optical flow information detection process, so the quantity of active pixel units acquired by the first optical frame is relatively small (it is impossible for the sparse active pixel units to form a valid time slope plane in the optical frame, so it is impossible to perform the analysis on the optical flows). Normal operation of each pixel collection circuit may not be adversely affected by the reading of the optical flow information, and when more and more optical flow frames are read continuously, more and more pixel collection circuits may enter the triggered state due to the change in the light intensity caused by the detection of the motion in the field of view, and then the optical flow information timing unit in each of the pixel collection circuits may be started. Through outputting the optical flow frames continuously, it is able to acquire the time information accumulated by all the started optical flow information timing units until a current frame reading time point. Through accumulating the time information (continuously scanning the optical flow frames), projections of the timing information onto the two-dimensional space of the pixel array 111 may gradually form a slope plane (a time slope). The valid optical flow information may be extracted through analyzing the gradient information and the aspect information of the time slope, so as to detect a movement direction and a movement speed. At this time, one complete optical flow information detection process may be ended, and a next optical flow information detection process may be started.

In a possible embodiment of the present disclosure, times desired for the optical flow information detection processes may be different from each other depending on the movement speed. For the object moving at a high speed, it is able to accumulate sufficient triggered pixel units within a relatively short time period to form the active time slope, so the time desired for the optical flow information detection process may be relatively small, i.e., a small amount of optical flow frames are required for one motion detection process. For the object moving at a low speed, it needs to take a sufficiently long time to form a valid movement trajectory capable of being detected, so a long time is required for one motion detection process, i.e., a plurality of optical flow frames needs to be provided. As mentioned above, the normal operation of the pixel unit may not be adversely affected by the reading of the optical flow frames, and the time information about the triggered pixel units may be valid all the time (until the timing unit has expired), so it is able to form the active time slope for the optical flow analysis as long as the detection time is sufficiently long.

For the collection of the image frame, the global control unit 114 may provide the global image information collection signal, so as to control image collection units in all the pixel collection circuits in the array 111 to sample the first electric signals related to the light intensity. The image preprocessor 120 may read, through the image information reading unit 112, the first electric signals related to the light intensity from all the pixel collection circuits at a time point when the image information collection signal is valid, and perform amplification and analog-to-digital conversion on the first electric signals. Data outputted by the image preprocessor may be used to generate a complete background grayscale image on which the extracted optical information is marked. The pixel collection circuit array 111 may sample the first electric signals related to the light intensity synchronously, and through this control mechanism similar to global shutter, it is able to acquire a clear and non-lagged background image.

In order to describe how to acquire the optical flow information by the optical flow sensor 110 in more details, a process of extracting the optical flow information in accordance with the optical flow frames outputted by the optical flow sensor 110 will be described hereinafter in conjunction with FIGS. 3A-3F.

Figure 3A:
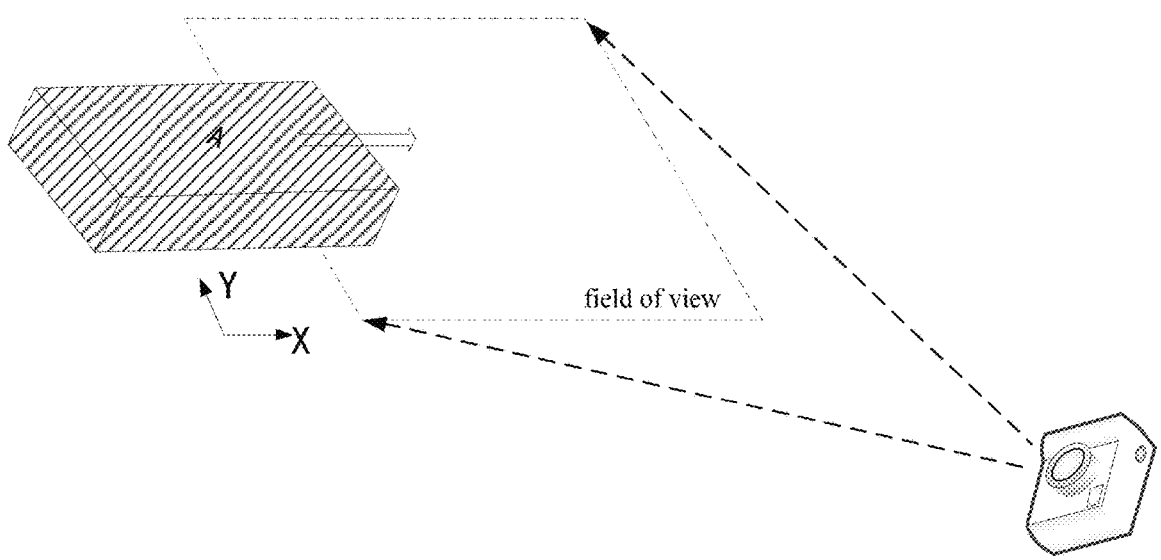
FIGS. 3A-3F are schematic views showing the extraction of optical flow information by the optical flow sensor 110 according to one embodiment of the present disclosure.
Figure 3B:
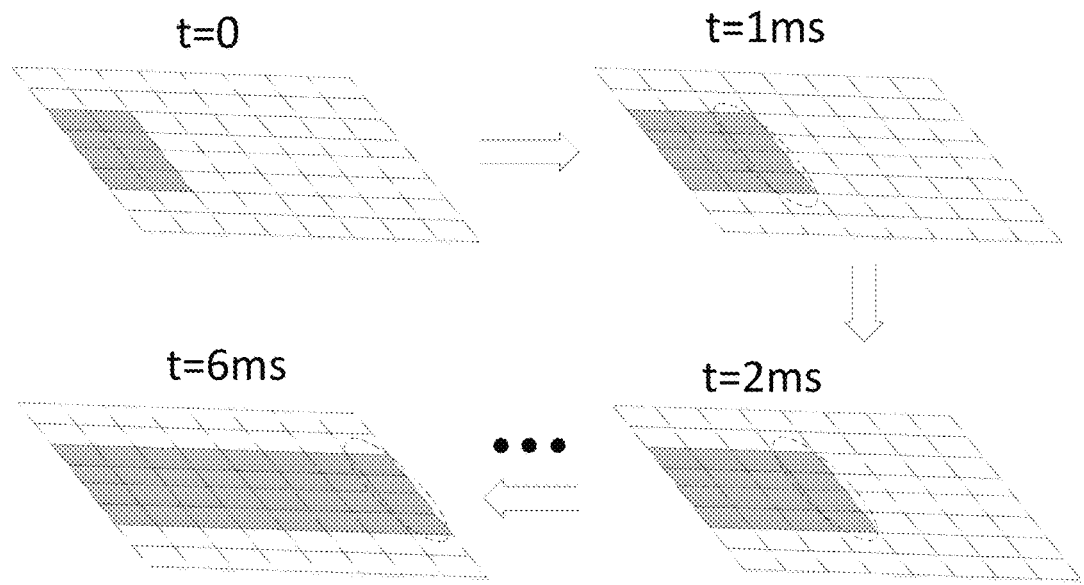

For ease of description, a simple scenario may be selected. As shown in FIG. 3A, a cube A with a regular shape and uniform texture moves along a direction X into the field of view of the optical flow sensor 110 at a certain speed. In FIG. 3A, the object A is filled with slashes, and it means that a brightness value of the object A is smaller than a background brightness value. It should be appreciated that, this scenario is selected for ease of description only, and the optical flow sensor in the embodiments of the present disclosure may also be applied to a scenario where an object with an irregular shape and non-uniform texture moves at different speeds along a complex movement trajectory. In addition, for convenience, the array 111 of the optical flow sensor 110 may merely include 8*8 pixel collection circuits, where P(x,y) represents a pixel in an $x^{th}$ row and a $y^{th}$ column. FIG. 3B shows images viewed in the scenario at different time points. At an initial time point (t=0), a rectangular region defined by a pixel P(3,1) and a pixel P(6,2) is occupied by the object A and is thus set to gray. A background with high brightness is detected by the other pixels, so a corresponding region is set to white. As the object A moves, the pixel units in the movement trajectory of the object A may be in the triggered state, because these pixel units may detect the change in the light intensity, i.e., from the initial large background brightness value to a low brightness value (the other pixel units may not be triggered because there no change in the light intensity has been detected). As mentioned above, once the pixel unit is triggered, the optical flow information timing unit of the pixel unit may be started to report the time information about a time point relative to an optical flow frame reading time point. As the object moves and the optical flow frames are outputted continuously, the subsequent optical flow frames may form a more complete time-mapping image because more pixel units have been triggered. In this scenario, for quantitative description, it is presumed that the movement speed of the object is one piece per millisecond, and each pixel unit may enter the triggered state when a half of the pixel unit is covered by an image of the object. At t=1 ms, the image of the object A may move by one column to the right (because the object moves along the direction X at a speed of one piece per millisecond), and at t=2 ms, the image of the object A may move by two columns to the right. With the elapse of time, the image in FIG. 3B may be acquired in the field of view.

For the reading operation on the optical flow frames, how to acquire triggering time information about the triggered pixel unit in accordance with the timing signal from the optical flow information timing unit in each pixel unit will be described hereinafter.

Figure 3C:
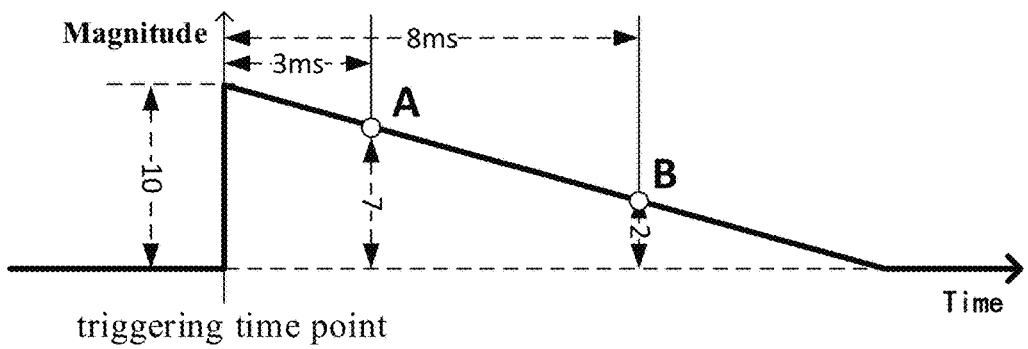
Figure 3D:
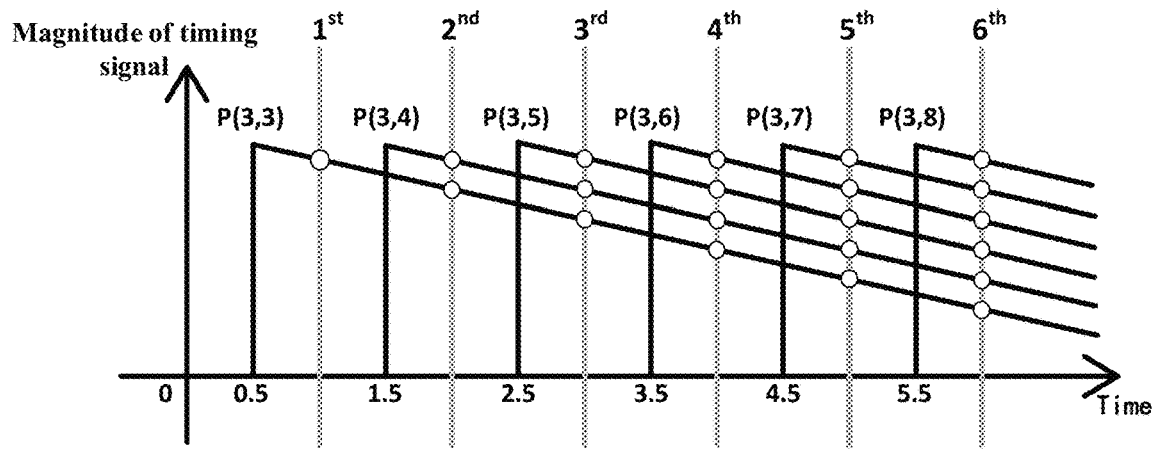

FIG. 3C shows the timing signals generated by the optical flow information timing unit in each pixel unit. It should be appreciated that, the timing signal is for illustrative purpose only, and actually any other form may also be adopted to achieve a same effect. The timing signal, as a single ramp signal, may be generated at a time point when the pixel unit is triggered, and then attenuated gradually. A slope of a magnitude of the timing signal relative to time is already known and adjustable. The optical flow information reading unit may continuously scan the optical flow information timing units in the entire pixel array, so as to acquire the consecutive optical flow frames. Within an individual optical flow frame, the time information about a current time point when the optical flow frame is outputted relative to the time point when the pixel unit is triggered through detecting the magnitude of the timing signal. For example, when the magnitude of the entire ramp signal is 10 units, the slope relative to the time is 1 unit per millisecond, and a magnitude of the timing signal within a certain optical flow frame is 7 (as shown by point A in FIG. 3C), it may be determined that the pixel unit has been triggered for 3 milliseconds at the current optical flow reading time point. When the magnitude of the timing signal is 2 (as shown by point B in FIG. 3C), it may be determined that the pixel unit has been triggered for 8 milliseconds at the current optical flow reading time point. Hence, the time information about the pixel unit read within each optical flow frame actually represents how long the pixel unit has been triggered at the optical flow frame reading time point, and this time information may be calculated by the optical flow preprocessor in accordance with the magnitude of the transient timing signal from each pixel unit. The earlier the pixel unit is triggered, the smaller the magnitude of the timing signal; the later the pixel unit is triggered, the larger the magnitude. The magnitudes of the timing signals generated by the pixel units that have not been triggered yet and the pixel units that have been triggered for a long time period may be very small, as shown in FIG. 3D. FIG. 3D shows timing signals generated by six pixel units, i.e., P(3,3) to P(3,8). In the above-mentioned scenario, the six pixel units may be triggered sequentially, the corresponding optical flow information timing units may be started sequentially, and the generated timing signals may be translated relative to each other in a time axis. For the optical flow frame outputted at a first time point, merely P(3,3) has been triggered, so the acquired triggering time information about the pixel unit P(3,3) may be 0.5 ms. For the optical flow frame outputted at a sixth time point, all the six pixel units have been triggered, so the triggering time information about these pixel units may be acquired. P(3,3) is triggered earliest while P(3,8) is triggered latest, so the magnitudes of the corresponding timing signals may increase gradually. It may be determined that P(3,3) has been triggered for 5.5 ms and P(3,8) has been triggered for 0.5 ms at the current reading time point in accordance with the slope of each timing signal relative to the time and the transient magnitude of each timing signal at the reading time point.

The acquisition of the two-dimension time slope plane in accordance with the extracted time information and the extraction of the active optical flow information in accordance with the time slope plane will be described hereinafter.

Figure 3E:
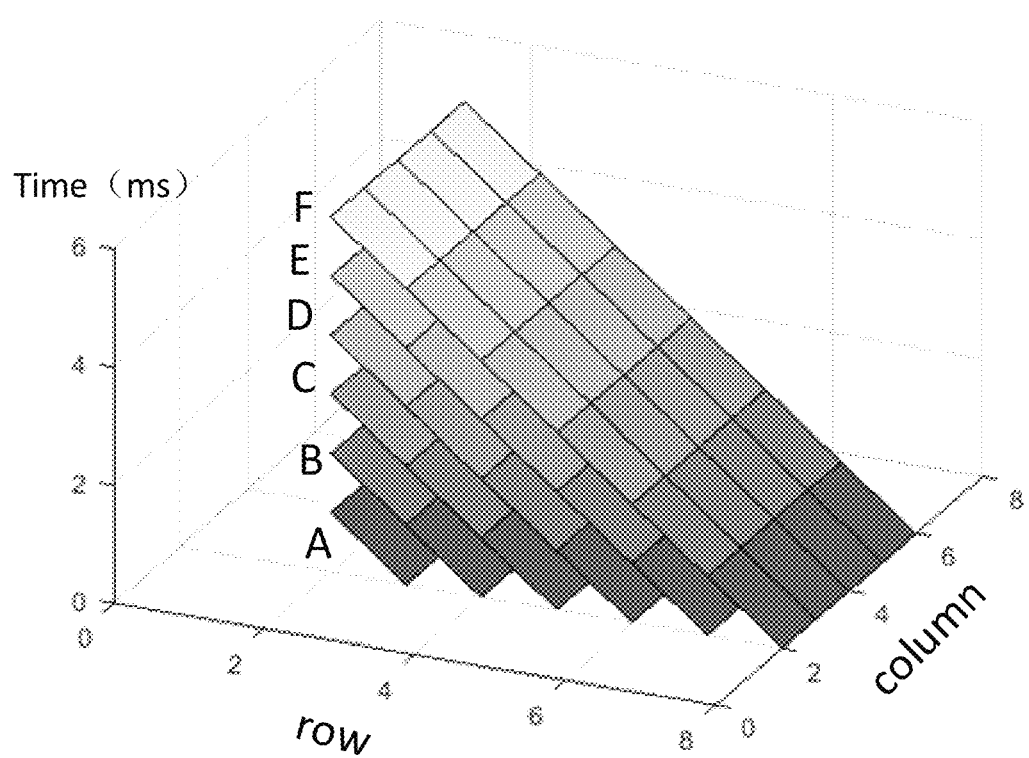

The pixel units P(3,3) to P(6,3) may be triggered at 0.5 ms (because at this time point, a half of each pixel unit may be covered by the moving object), and at this time point, the optical flow information timing unit in each pixel unit may be started. Identically, along with the movement of the object, the pixel units P(3,4) to P(6,4) may be triggered at 1.5 ms, and at this time point, the optical flow information timing unit in each pixel unit may be started. At this time, P(3,3) to P(6,3) have been triggered for 1 ms, so a value of the timing unit in each pixel unit may be 1 ms. Hence, the pixel units in a fifth column to an eighth column (in a third row to a sixth row) may enter the triggered state at 2.5 ms to 5.5 ms, and the optical flow information timing unit in each pixel unit may be started correspondingly. In addition, the optical flow information reading unit of the optical flow sensor may continuously scan the pixel array to read the timing signals generated by the optical flow information timing units in the pixel units, and generate the two-dimensional time-mapping image. For ease of analysis, it is presumed that one optical flow frame is outputted by the optical flow sensor 110 every one millisecond. FIG. 3E shows the time-mapping images formed by the optical flow frames, where A to F represent the time-mapping images formed by the optical flow frames read at 1 ms to 6 ms respectively. For the optical flow frames outputted at a first millisecond, merely P(3,3) to P(6,3) have been triggered, so the timing signal for the pixel units may be 0.5 ms within the optical flow frame, and a resultant time-mapping image is shown by A in FIG. 3E. For the optical flow frame at a second millisecond, P(3,4) to P(6,4) have been additionally triggered at 1.5 ms, so P(3,3) to P(6,3) and P(3,4) to P(6,4) may be triggered within the optical flow frame. Within this optical flow frame, the timing signal for P(3,3) to P(6,3) may be 1.5 ms, the timing signal for P(3,4) to P(6,4) may be 0.5 ms, and a resultant time-mapping image is shown by B in FIG. 3E. Similarly, the time-mapping images formed by the optical flow frames outputted at 3 ms to 6 ms are shown by C to F in FIG. 3E. As shown in FIG. 3E, more triggered pixel units may be detected within a later optical flow frame than a previous optical flow frame, so a more active time slope plane may be formed in the time-mapping image. For the object at a high speed, its movement trajectory may extend rapidly, so it is able to accumulate sufficient pixel units within a relatively short time period to form the active time slope plane, i.e., it is able to detect the optical flow information within few optical flow frames. For the object at a low speed, its movement trajectory may extend slowly, so it may take a relatively long time period to accumulate sufficient pixel units to form the active time slope plane, i.e., it is necessary to provide more optical flow frames to detect the optical flow information. Hence, the optical flow sensor 110 may detect the objects at different speeds as long as the active time slope plane is accumulated within a sufficient long time period. In addition, the detection of the optical flow information may be completely independent of the output of the image information, so during the detection of the optical flow information, the optical flow sensor 110 may still output the clear, non-lagged image at a high speed.

Figure 3F:
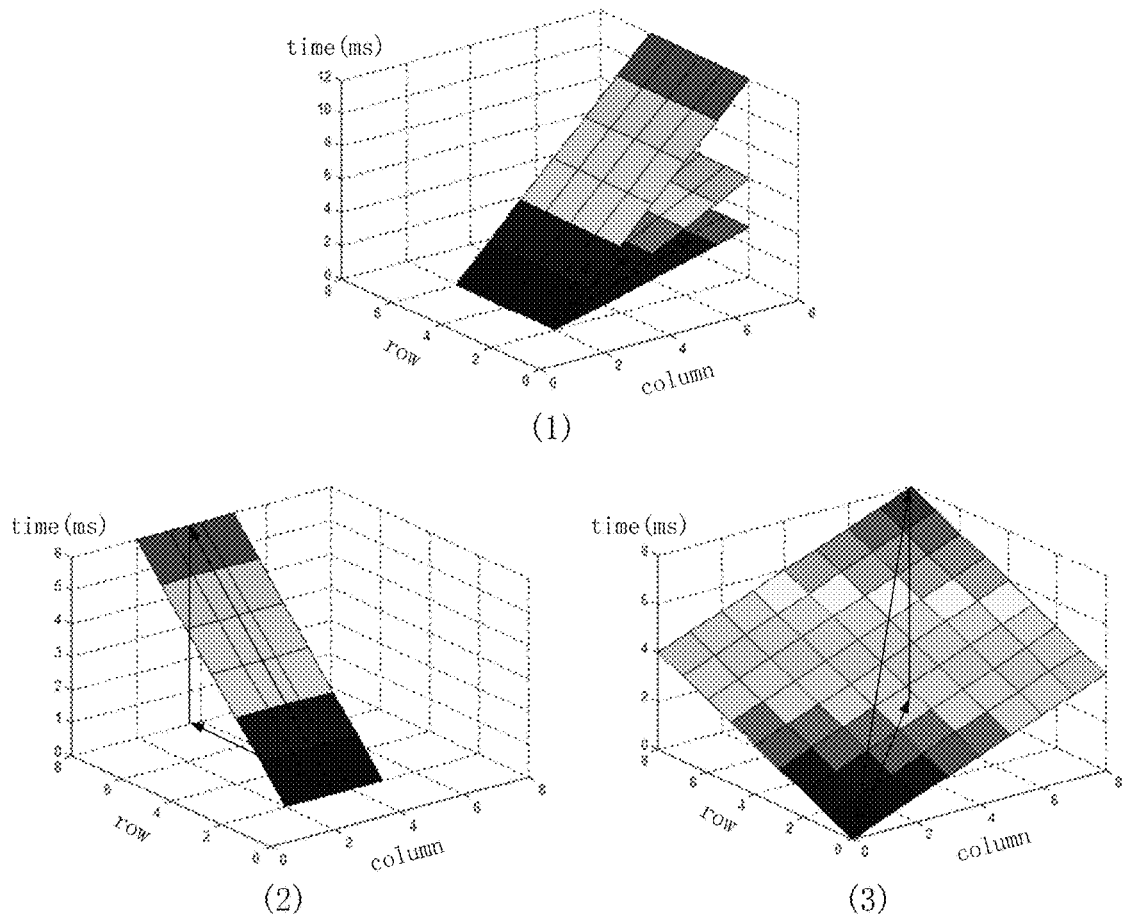

In a possible embodiment of the present disclosure, the optical flow analysis may be performed conveniently in accordance with information about a time slope acquired through mapping the optical flow frames generated by the optical flow information reading unit 113. Information about a movement speed and a movement direction of the object may be represented by steepness and aspect of the time slope. In FIG. 3F, (1) shows the time slopes formed when the object passes through the field of view in a direction opposite to an X-axis at different speeds. The object moves in the same direction, so the aspects of the three time slopes may be the same. However, the steepness of the time slopes may be different due to different speeds. The three time slopes with gradients decreasing gradually may correspond to the movement speeds of 0.5 pixel per millisecond, 1 pixel per millisecond, and 2 pixels per millisecond respectively. Hence, the smaller the movement speed of the object, the steeper the time slope; and the larger the movement speed, the gentler the time slope. In addition, in FIG. 3F, (2) and (3) show the time slopes formed when the object moves in a direction opposite to a Y-axis and in a direction acquired by rotating the X-axis by 45° counterclockwise. The movement direction of the object may be acquired conveniently in accordance with a projection of the aspect of the corresponding time slope onto a plane defined by the X-axis and the Y-axis in FIG. 3F.

The pixel collection circuit in the pixel collection circuit array 111 will be described hereinafter in conjunction with FIG. 4, which shows the pixel collection circuit 400 according to one embodiment of the present disclosure.

Figure 4:
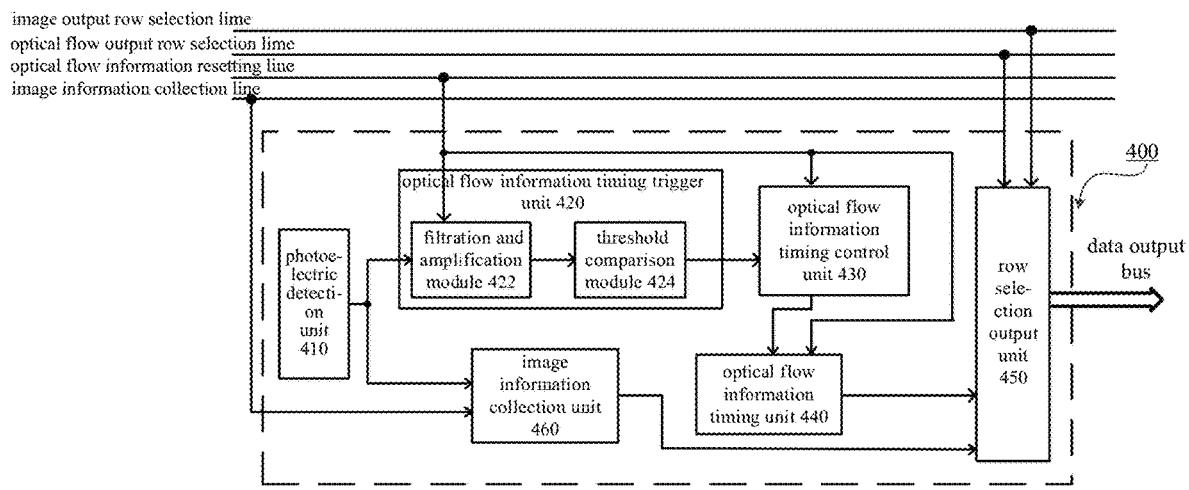
FIG. 4 is a schematic view showing a pixel collection circuit 400 according to one embodiment of the present disclosure.

As shown in FIG. 4, the pixel collection circuit 400 may at least include a photoelectric detection unit 410, an optical flow information timing trigger unit 420, an optical flow information timing control unit 430, an optical flow information timing unit 440 and a row selection output unit 450. In a possible embodiment of the present disclosure, the pixel collection circuit may further include an image information collection unit 460. An optical flow information resetting line and an image information collection line in FIG. 4 are coupled to the optical flow acquisition unit 1144 and the image acquisition unit 1142 of the global control unit 114 respectively, an image output row selection line is coupled to the image information reading unit 112, an optical flow output row selection line is coupled to the optical flow information reading unit 113, and a data output bus is coupled to the image information reading unit 112 and the optical flow treading unit 113.

The photoelectric detection unit 410 is configured to output a first electric signal representing an intensity of a received optical signal in real time. Here, the photoelectric detection unit 410 may be, but not limited to, a logarithmic photoelectric detector. FIGS. 5A, 5B, 5C and 5D show the photoelectric detection unit 410.

In FIG. 5A, the photoelectric detection unit 410 may include a photodiode $PD_1$ whose anode is grounded, and a first transistor $T_1$, a source electrode of which is connected to a cathode of the photodiode $PD_1$, and a drain electrode and a gate electrode of which are connected to a power source VDD. In an application scenario, the photodiode $PD_1$ may generate a current I upon the receipt of the optical signal. Based on this, there is a linear relationship between ln I and a change in a voltage generated between the source electrode and the gate electrode of the first transistor $T_1$. In other words, the first electric signal from the photoelectric detection unit 410 may be in logarithmic relation with the intensity of the received optical signal.

As shown in FIG. 5B, the photoelectric detection unit 410 may include a photodiode $PD_1$ whose anode is grounded, a first transistor $T_1$ and a first amplifier $A_1$. A source electrode of the first transistor $T_1$ may be connected to a cathode of the photodiode $PD_1$, and a drain electrode of the first transistor $T_1$ may be connected to the power source VDD. The first amplifier $A_1$ may be connected between the cathode of the photodiode $PD_1$ and a gate electrode of the first transistor $T_1$. Here, through the first amplifier $A_1$, it is able to generate a voltage change between the source electrode and the gate electrode of $T_1$ at a larger response speed. In other words, through the first amplifier $A_1$, it is able for the pixel collection circuit to detect the light intensity change in a more rapid manner.

As shown in FIG. 5C, the photoelectric detection unit may include a photodiode $PD_1$ whose anode is grounded, and N transistors connected to each other in series (N≥2, FIG. 5C, N is 2, but the value of N may not be limited thereto). A source electrode of a first transistor may be connected to a cathode of the photodiode $PD_1$, a drain electrode of an $N^{th}$ transistor may be connected to the power source VDD, a gate electrode of each transistor may be connected to a drain electrode of a previous transistor, and a source electrode of each of the second to the $N^{th}$ transistors may be connected to a drain electrode of the previous transistor. Here, through the N transistors connected to each other in series, it is able to increase a current (voltage) gain of the photoelectric detection unit.

As shown in FIG. 5D, on the basis of the structure in FIG. 5C, the photoelectric detection unit 410 may further include a first amplifier $A_1$ connected between the cathode of the photodiode $PD_1$ and the gate electrode of the first transistor. Apart from the structures mentioned hereinabove, the photoelectric detection unit 410 may also be any well-known highly real-time photoelectric detector, which will not be particularly defined herein.

It should be appreciated that, for a conventional photoelectric detection technology, usually a capacitor needs to be charged, then the photoelectric detection unit needs to be exposed continuously (i.e., the capacitor needs to be discharged continuously), and then an accumulated light intensity may be determined in accordance with a remaining capacity of the capacitor. In the embodiments of the present disclosure, it is unnecessary to expose the photoelectric detection unit when the first electric signal representing the intensity of the optical signal has been generated by the photoelectric detection unit 410, so it is able for the photoelectric detection unit 410 to output the first electric signal without any delay.

The collection of the optical flow information in each pixel unit may be performed by the optical flow information timing trigger unit 420, the optical flow information timing control unit 430 and the optical flow information timing unit 440. The three units may be controlled by a global resetting signal from the optical flow acquisition unit 1144, and when the resetting signal is valid, the three units related to the optical flow information detection may be reset. When the resetting signal has been canceled, one optical flow information detection process may be started, and the optical flow information reading unit 113 may continuously scan the optical flow information timing units 440 in all the pixel units until sufficient active pixel units have been accumulated within the optical flow frames for the optical flow analysis. Functions and implementations of the three units will be described hereinafter.

A first input terminal of the optical flow information timing trigger unit 420 may be coupled to an output terminal of the photoelectric detection unit 410, a second input terminal thereof may be coupled to the optical flow information resetting line. In a possible embodiment of the present disclosure, the optical flow information timing trigger unit 420 may include a filtration and amplification module 422 and a threshold comparison module 424. The optical flow information timing trigger unit 420 may be reset at an initial stage of one optical flow information detection process, and then generate an optical flow information timing trigger signal in the optical flow information detection process when a change in the first electric signal (representing the light intensity) outputted by the photoelectric detection unit 410 meets a preset trigger condition, and transmit the optical flow information timing trigger signal to the rear-end optical flow information timing control unit 430.

In order to effectively extract the optical flow information, the preset trigger condition may be that the first electric signal changes sufficiently rapidly for a sufficiently long time period. The first electric signal may respond to the optical signal received by the photoelectric detection unit 410 in real time, so the above-mentioned requirement on the first electric signal may also be applied to the optical signal. Any change in the light intensity at a sufficiently high speed and a sufficiently large value may be considered as being caused by the valid movement of the object. In contrast, a change in the light intensity at a low speed or a small value may probably be caused by drift or jittering of the background, and thereby it may be worthless. In order to meet the above-mentioned requirement, the optical flow information timing trigger module 420 may include the filtration and amplification module 422 and the threshold comparison module 424. The filtration and amplification module 422 is configured to perform a preprocessing operation on the first electric signal to generate a second electric signal, and the preprocessing operation may include at least one of an amplification operation and a filtration operation. The threshold comparison module 424 is configured to determine whether the second electric signal is greater than a first threshold and/or whether the second electric signal is smaller than a second threshold, and when the second electric signal is greater than the first threshold or smaller than the second threshold, generate the optical flow information timing trigger signal. In a possible embodiment of the present disclosure, in the preprocessing operation, the amplification operation may be used to increase the detection sensitivity of the pixel collection circuit on the light intensity, but this operation is not indispensable. Usually, the filtration operation may refer to high-pass filtration, i.e., the change in the light intensity at a low speed, rather than the change in the light intensity at a high frequency, i.e., at a sufficiently high speed, may be filtered.

The filtration and amplification module 422 may use, but not limited to, various well-known filtration and amplification technologies. FIGS. 6A, 6B, 6C and 6D show the filtration and amplification module 422.

As shown in FIG. 6A, the filtration and amplification module 422 may include a second amplifier $A_2$ and a high-pass filter. A positive pole of the second amplifier $A_2$ may be coupled to the output terminal of the photoelectric detection unit 410, and a negative pole thereof may be coupled to a first pull-down resistor $R_1$. A second resistor $R_2$ may be coupled between an output terminal and the negative pole of the second amplifier. The second amplifier $A_2$, the first resistor $R_1$ and the second resistor $R_2$ may cooperate to provide an amplification function, and a gain may be related to a ratio of a resistance of $R_2$ to a resistance of $R_1$. The high-pass filter coupled to the second amplifier $A_2$ is configured to filter out a signal component in the amplified first electric signal whose frequency is smaller than a frequency threshold, so as to output the second electric signal.

As shown in FIG. 6B, the filtration and amplification module 422 may include a first capacitor $C_1$, a second amplifier $A_2$, a second capacitor $C_2$, a third resistor $R_3$ and a first switch $K_1$. A first terminal of the first capacitor $C_1$ may be coupled to the output terminal of the photoelectric detection unit 410. A positive pole of the second amplifier $A_2$ may be coupled to a terminal at a fixed potential, and a negative pole thereof may be coupled to a second end of the first capacitor $C_1$. The second capacitor $C_2$, the third resistor $R_3$ and the first switch $K_1$ may be connected in parallel to each other between the negative pole and an output terminal of the second amplifier $A_2$. When the resetting signal is valid, the first switch $K_1$ may be turned on, and when the resetting signal has been canceled, the first switch $K_1$ may be turned off. In FIG. 6B, the first capacitor $C_1$ may isolate a direct current component in the first electric signal. A ratio of a capacitance of the first capacitor $C_1$ to a capacitance of the second capacitor $C_2$ may be in direct proportion to the gain of the filtration and amplification module 422. In addition, the second capacitor $C_2$ and the third resistor $R_3$ may together form a filter, and the third resistor $R_3$ may be an adjustable resistor. The filter may filter out a signal component in an alternating current component in the first electric signal whose frequency is smaller than a frequency threshold. Here, the frequency threshold may depend on a resistance of $R_3$. For example, the resistance of $R_3$ may be adjusted by the system 100 in accordance with an indication signal from the global control unit 114, and this indication signal may be determined in accordance with, but not limited to, a user input.

As shown in FIG. 6C, the filtration and amplification module 422 may include a second amplifier $A_2$, a first capacitor $C_1$, a first switch $K_1$ and a high-pass filter. A positive pole of the second amplifier $A_2$ may be coupled to the output terminal of the photoelectric detection unit 410. A first terminal of the first capacitor $C_1$ may be coupled to a negative pole of the second amplifier $A_2$, and a second terminal thereof may be coupled to a terminal at a fixed potential (usually the terminal at the fixed potential may be, but not limited to, a ground terminal). The first switch $K_1$ may be coupled between the first terminal of the first capacitor $C_1$ and the output terminal of the photoelectric detection unit 410. The high-pass filter may be coupled to the second amplifier $A_2$, and configured to filter out a signal component in the amplified first electric signal whose frequency is smaller than a predetermined frequency threshold to generate the second electric signal. When the resetting signal is valid, the first switch $K_1$ may be turned on, and when the resetting signal has been canceled, the first switch $K_1$ may be turned off. When an optical flow output mode is enabled, the first capacitor $C_1$ may store, under the control of the first switch $K_1$, the first electric signal outputted by the photoelectric detection unit 410 as a reference level. Then, the second amplifier $A_2$ may detect and amplify a difference between the real-time first electric signal and the reference level.

FIGS. 6A, 6B and 6C show the amplification and filtration operation on a relative change amount of the first electric signal. In addition, the filtration and amplification module 422 may further detect the change in the light intensity through directly detecting a change rate of the first electric signal, as shown in FIG. 6D. The filtration and amplification module 422 may include a first capacitor $C_1$, a current replicator $P_1$, a second amplifier $A_2$, a second capacitor $C_2$, a first switch $K_1$ and a third resistor $R_3$. A first terminal of the first capacitor $C_1$ may be coupled to the output end of the photoelectric detection unit 410. A first terminal of the current replicator $P_1$ may be coupled to a second terminal of the first capacitor $C_1$. A positive pole of the second amplifier $A_1$ may be coupled to a terminal at a fixed potential, and a negative pole thereof may be coupled to a second terminal of the current replicator $P_1$. The second capacitor $C_2$, the first switch $K_1$ and the third resistor $R_3$ may be connected in parallel to each other between the negative pole and an output terminal of the second amplifier $A_2$. When the resetting signal is valid, the first switch $K_1$ may be turned on, and when the resetting signal has been canceled, the first switch $K_1$ may be turned off. The first terminal and the second terminal of the current replicator $P_1$ may be coupled to a first current source $I_1$ and a second current source $I_2$ respectively. The first terminal of the current replicator $P_1$ may be clamped at a fixed level, and the current replicator $P_1$ may replicate a current from the first capacitor $C_1$ to the second current source $I_2$ through the first current source $I_1$. The current replicator $P_1$ may be implemented using various well-known technologies, which will not be particularly defined herein. One terminal of the first capacitor $C_1$ may receive the first electric signal from the photoelectric detection unit 410, and the other terminal may receive the fixed level. Depending on a voltage-current relationship across the capacitor, the current flowing through the first capacitor $C_1$ may be in direct proportion to the change rate of the first electric signal, and this current may be replicated to the second current source $I_2$ through the first current source $I_1$ to charge/discharge the second capacitor $C_2$, so as to generate the second electric signal. In this regard, a magnitude of the second electric signal may be determined in accordance with the change rate of the first electric signal (a size of a charging/discharging current $I_2$) and a change duration (a duration of the charging/discharging current $I_2$). A relatively large second electric signal may be generated merely with respect to the first electric signal (light intensity) with a long duration and a large change rate. In addition, the third resistor $R_3$ may be adjustable and serve as a bleeder resistor, so as to cancel out a charging effect on the second capacitor $C_2$ when the second current source $I_2$ is very small, and filter out a signal component in an alternating current component in the first electric signal whose frequency is smaller than a frequency threshold, thereby to achieve a high-pass filtration function.

An input terminal of the threshold comparison module 424 may be coupled to the output terminal of the filtration and amplification module 422. As mentioned hereinabove, the threshold comparison module 424 is configured to determine whether the second electric signal is greater than the first threshold and/or whether the second electric signal is smaller than the second threshold, and when the second electric signal is greater than the first threshold or smaller than the second threshold, generate the optical flow information collection trigger signal. Depending on a desired configuration, the threshold comparison module 424 may merely determine whether the second electric signal is greater than the first threshold, or merely determine whether the second electric signal is smaller than the second threshold, or determine whether the second electric signal is greater than the first threshold and whether the second electric signal is smaller than the second threshold. The second threshold may be smaller than the first threshold. In this way, the threshold comparison module 424 may determine whether the change in the light intensity for the pixel collection circuit 400 is relatively large (the light intensity may increase or decrease). FIGS. 7A, 7B, 7C and 7D show the threshold comparison module 424. It should be appreciated that, the following description on the threshold comparison module 424 is for illustrative purposes only, but shall not be used to limit the scope of the present disclosure.

As shown in FIG. 7A, the threshold comparison module 424 may include a first voltage comparator $VC_1$, a reverse-phase input terminal of which is coupled to a signal line for providing the first threshold, and an in-phase input terminal of which is coupled to the output terminal of the filtration and amplification module 422. In this way, the threshold comparison module 424 may determine whether the second electric signal is greater than the first threshold.

As shown in FIG. 7B, the threshold comparison module 424 may include a second voltage comparator $VC_2$, an in-phase input terminal of which is coupled to a signal line for providing the second threshold, and a reverse-phase input terminal of which is coupled to the output terminal of the filtration and amplification module 422. In this way, the threshold comparison module 424 may determine whether the second electric signal is smaller than the second threshold.

As shown in FIG. 7C, the threshold comparison module 424 may include a first voltage comparator $VC_1$, a second voltage comparator $VC_2$ and an OR gate. A reverse-phase input terminal of the first voltage comparator $VC_1$ may be coupled to a signal line for providing the first threshold, and an in-phase input terminal thereof may be coupled to the output terminal of the filtration and amplification module 422. An in-phase input terminal of the second voltage comparator $VC_2$ may be coupled to a signal line for providing the second threshold, and a reverse-phase input terminal thereof may be coupled to the output terminal of the filtration and amplification module 422. A first input terminal of the OR gate may be coupled to an output terminal of the first voltage comparator, and a second input terminal thereof may be coupled to an output end of the second voltage comparator, so as to perform an OR operation on an output from the first voltage comparator and an output from the second voltage comparator.

As shown in FIG. 7D, the threshold comparison module 424 may include: a voltage difference comparator $VD_1$, a first input terminal of which is coupled to a pull-down third capacitor $C_3$, a second input end of which is coupled to a pull-down fourth capacitor $C_4$, and which is configured to output a differential signal between the first input terminal and the second input terminal; a second switch $K_2$ arranged between the third capacitor $C_3$ and the output terminal of the filtration and amplification module 422; a first buffer $B_1$ and a third switch $K_3$ connected in series between the third capacitor $C_3$ and the fourth capacitor $C_4$; a first voltage comparator $VC_1$, a reverse-phase input terminal of which is coupled to a signal line for providing the first threshold, and an in-phase input terminal of which is coupled to an output terminal of the voltage difference comparator; a second voltage comparator $VC_2$, an in-phase input terminal of which is coupled to a signal line for providing the second threshold, and a reverse-phase input terminal of which is coupled to the output terminal of the voltage difference comparator; and an OR gate, a first input terminal of which is coupled to an output terminal of the first voltage comparator, a second input terminal of which is coupled to an output terminal of the second voltage comparator, and an output terminal of which is coupled to the third switch $K_3$. When the differential signal from the voltage difference comparator is greater than the first threshold or smaller than the second threshold, the threshold comparison module 424 may output the optical flow timing trigger signal, and turn off the second switch $K_2$, turn on the third switch $K_3$, turn off the third switch $K_3$ and turn on the second switch $K_2$ sequentially. In this way, the threshold comparison module 424 may update a signal maintained at the second input terminal as the second electric signal at the first input terminal.

The optical flow information timing control unit 430 may receive the optical flow information timing trigger signal generated by the front-end optical flow information timing trigger unit 420, and generate a timing start signal for the rear-end optical flow information timing unit 440. The optical flow information timing control unit mainly consists of two parts, i.e., a latch and a pulse shaper. In a possible embodiment of the present disclosure, the latch may be reset when the resetting signal is valid, and may be set when the optical flow information timing trigger signal has been received initially. A setting state of the latch may be maintained until a next resetting signal is valid (i.e., until a next optical flow information detection process starts). The pulse shaper may receive a latching signal from the latch, and generate a narrow pulse signal as the timing start signal for the rear-end optical flow information timing unit 440 when the latch is set. In some embodiments of the present disclosure, the pulse shaper is not indispensable, and it may also be arranged in the optical flow information timing unit 440.

Through the optical flow information timing control unit 430 with the above-mentioned structure, it is able to ensure, in the optical flow information detection process, that the optical flow information timing unit 440 in the pixel unit is merely started when the change in the light intensity initially detected by the pixel unit meets the threshold requirement (the timing trigger signal is outputted by the optical flow information timing trigger unit 420), rather than being started repeatedly. This is because, the latch in the optical flow information timing control unit 430 may not be reset on its own initiative after it has been set initially (it may be forced to be reset when a next resetting signal is valid). In the optical flow information detection process, this feature is necessary for the optical flow analysis through continuously updating the optical flow frames to accumulate sufficient time information generated by the active pixel units.

The optical flow information timing unit 440 may be a timing unit in the pixel unit. It may be reset at an initial stage of the optical flow information detection process, and may be started at a trigger time point of the pixel unit. When the pixel unit is read by the optical flow information reading unit, the time information at a time point when the pixel unit is activated may be acquired in accordance with the current timing information from the optical flow timing unit 440.

FIG. 8A shows the optical flow information timing unit 440. As shown in FIG. 8A, the optical flow information timing unit 440 may include a fourth switch $K_4$, a fifth switch $K_5$, a fifth capacitor $C_5$ and a third transistor $T_3$. The fifth switch $K_5$, the fifth capacitor $C_5$ and the third transistor $T_3$ may be connected in parallel between the fourth switch $K_4$ and a terminal at a fixed potential (it may be, but not limited to, a ground terminal in FIG. 8A). A first terminal of the fourth switch $K_4$ may be coupled to the fifth switch $K_5$, the fifth capacitor $C_5$ and the third transistor $T_3$, and a second terminal thereof may be coupled to another terminal at a fixed potential (it may be, but not limited to, a power source in FIG. 8A). A gate voltage of the third transistor $T_3$ may be a bias voltage applied by an external input, so $T_3$ may be equivalent to a current source and its current may be adjusted in different application scenarios. When the resetting signal is valid, the fifth switch $K_5$ may be turned on, an upper electrode plate of the third capacitor $C_5$ may be discharged to a ground potential. Upon the receipt of a timing start pulse from the front-end optical flow information timing control unit 430, the fourth switch $K_4$ may be turned on for a short time period and then turned off. An upper electrode plate of the fifth capacitor $C_5$ may be rapidly pulled up to a power source voltage ($K_4$ is turned on), and then discharged slowly via the third transistor $T_3$ ($K_4$ is turned off), so as to form a descending ramp signal as shown in FIG. 3C. Actually, the ramp signal is a timing signal, and the time information at the trigger time point of the pixel unit may be acquired through reading magnitude information about the signal. The larger the magnitude of the signal, the later the pixel unit has been triggered (the later the movement occurs); the smaller the magnitude of the signal, the earlier the pixel unit has been triggered (the earlier the movement occurs). Because a minimum potential is just the ground potential (i.e., the voltage cannot decrease when it reaches the ground potential), a range of the active time information generated by the optical flow information timing unit 440 may be limited, and the time information beyond the range may be merely represented as fixed values. Based on the above analysis, a timing range of the optical flow information timing unit 440 may depend on a slope of the ramp signal, and the slope may be determined in accordance with a discharging current of the third transistor $T_3$ and a capacitance of the fifth capacitor $C_5$. The smaller the discharging current and the larger the capacitance of the fifth capacitor $C_5$, the smaller the slope of the ramp signal, the more slowly the signal is attenuated and the wider the active timing range; in contrast, the larger the slope, the more rapidly the third transistor is discharged, and the narrower the active timing range. The ramp signal that changes slows may be effective for the detection of the movement at a low speed. In this case, usually it needs to take a sufficiently long time to acquire sufficient triggered pixel units corresponding to the movement trajectory for the optical flow analysis. When the active timing range is wide, after a sufficient long time period, the active timing information may be still generated by the pixel unit that was triggered previously, so it is able to acquire ideal time slope information. For the movement detection at a high speed, sufficient triggered pixel units may be accumulated within a relatively short time period, so a ramp signal with a large slope may be adopted.

Depending on different implementation modes of the current source, the optical flow information timing unit 440 may also be implemented as shown in FIG. 8B. In the optical flow information timing unit 440, a fifth switch $K_5$, a fifth capacitor $C_5$ and a fourth resistor $R_4$ may be connected in parallel between a fourth switch $K_4$ and a terminal at a fixed potential. A first terminal of the fourth switch $K_4$ may be coupled to the fifth switch $K_5$, the fifth capacitor $C_5$ and the fourth resistor $R_4$, and a second terminal thereof may be coupled to another terminal at a fixed potential. When the resetting signal is valid, the fifth switch $K_5$ may be turned on. In this way, charges stored in the fifth capacitor $C_5$ may be discharged via the fourth resistor $R_4$. After the optical flow information timing unit 440 has been started, the timing signal may be a voltage signal that is attenuated exponentially, and an attenuation speed may depend on a resistance of the fourth resistor $R_4$ and a capacitance of the fifth capacitor $C_5$. Generally speaking, the resistance of the fourth resistor $R_4$ needs to be very large, and it may be a transistor in an off state or a reverse-biased diode.

A first input terminal of the row selection output unit 450 may be coupled to the optical flow information timing unit 440, and a second input terminal thereof may be coupled to an optical flow output row selection line. The row selection output unit 450 is configured to cache the timing signal from the optical flow information timing unit 440 and transmit it to an optical flow data output bus when an optical flow row selection signal from the optical flow information reading unit 113 is valid. The optical flow data output bus may be coupled to the optical flow information reading unit 113. The optical flow information reading unit 113 may process data from the optical flow data output bus, and transmit the processed data to the external optical flow preprocessor 130.

In addition, the pixel collection circuit 400 may further include an image information collection unit 460 for collecting the image information. A first input terminal of the image information collection unit maybe coupled to the output terminal of the photoelectric detection unit 410, and a second input terminal thereof may be coupled to an image information collection line. The image information collection unit 460 is configured to receive an image information collection signal from the image information collection line, and sample and cache the first electric signal at a current reception time point. The image information collection signal is a global signal, so the image information collection units 460 of all the pixel collection circuits may synchronously sample the first electric signals from the respective photoelectric detection units 410. In this way, after the first electric signals from all the image information collection units 460 are read by the image preprocessor 120, it is able to acquire a complete grayscale image.

In a possible embodiment of the present disclosure, usually the image information collection unit 460 may consist of simple sampling-holding circuits, and each sampling-holding circuit may include one control switch and one sampling capacitor. A first input terminal of the control switch may be coupled to the output terminal of the photoelectric detection unit to receive the first electric signal, a second terminal thereof may be coupled to a first terminal of the sampling capacitor, and a second terminal of the sampling capacitor maybe coupled to a terminal at a fixed level. A control signal for the control switch may be a global image information collection signal. When the image information collection signal is valid, the control switch may be turned on, and the sampling capacitor of each pixel unit may sample the first electric signal from the photoelectric detection unit 410 of the pixel unit. When the image information collection signal is invalid, the control switch may be turned off, and the sampling capacitor may hold the sampled first electric signal, which is subsequently read by the image information reading unit 110 to the image preprocessor 120 for the formation of the image frame.

In another possible embodiment of the present disclosure, a third input terminal of the row selection output unit 450 may be coupled to the image information collection unit 460, and a fourth input terminal thereof may be coupled to an image output row selection line, so as to cache an input signal (i.e., the first electric signal) from the image information collection unit 460, and transmit it to the image data output bus when an image row selection signal from a row selection unit of the image information reading unit 112 is valid. The image data output bus may be coupled to the image information reading unit 112. The image information reading unit 112 may process data from the image data output bus, and transmit the processed data to the external image preprocessor 120.

In a word, the pixel collection circuit 400 in the embodiments of the present disclosure may output the image information and the optical flow information simultaneously. In addition, the image information and the optical flow information are transmitted to the external preprocessors respectively through separate reading channels, so the image frame and the optical flow frame may be collected by the optical flow sensor 110 in parallel and independent of each other.

Generally speaking, the optical flow information needs to be collected under the control of the global resetting signal as well as the optical flow information reading unit. It should be appreciated that, probably a plurality of optical flow frames needs to be provided for one optical flow information detection process. At the beginning of the optical flow information detection process, the resetting signal may be valid, and at this time, all the units related to the optical flow information detection in the pixel unit (e.g., the optical flow information timing trigger unit, the optical flow information timing control unit and the optical flow information timing unit) may be reset. Then, the resetting signal may be canceled and the optical flow information detection process may be performed. The optical flow information reading unit may scan the timing information from the optical flow information timing units in the entire pixel array to generate the optical flow frames. The image frames needs to be collected under the control of the image information collection signal from the global control unit as well as the image information reading unit. At the beginning of the collection of one image frame, the image information collection signal may be valid within a short time period, and each image information collection unit in the pixel array may sample and maintain the first electric signal from the photoelectric detection unit. Then, the image information reading unit may scan the first electric signals related to the light intensity and stored in the image information collection units in the entire pixel array one by one, so as to acquire a complete image frame.

Figure 9:
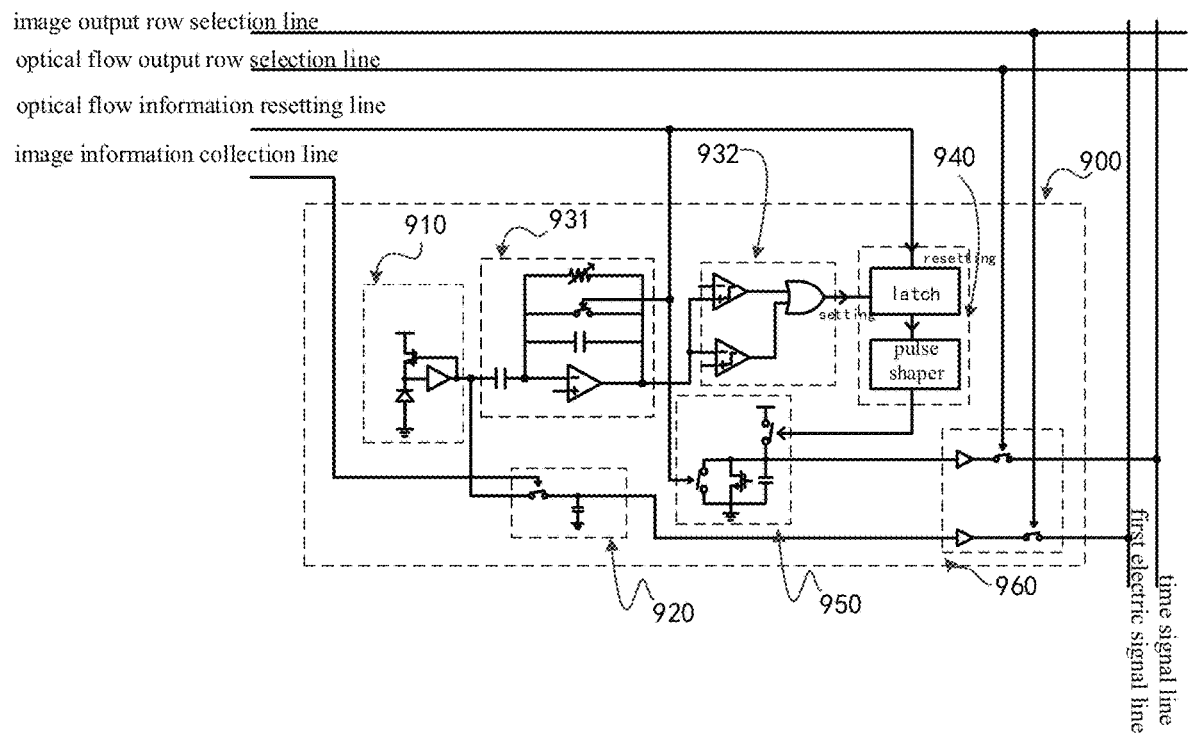
FIG. 9 is a schematic view showing a pixel collection circuit 900 according to one embodiment of the present disclosure.

The pixel collection circuit may be in various forms through combining the structures mentioned in FIGS. 4 to 8B, which will not be particularly defined herein. FIG. 9 shows one form of the pixel collection circuit 900.

As shown in FIG. 9, the pixel collection circuit 900 includes a photoelectric detection unit 910, an image information collection unit 920, a filtration and amplification module 931, a threshold comparison module 932, an optical flow information timing control unit 940, an optical flow information timing unit 950, and a row selection output unit 960. The filtration and amplification module 931 and the threshold comparison module 932 together form an optical flow information timing trigger unit 930 (not shown). The photoelectric detection unit 910 in FIG. 9 may be the photoelectric detection unit as shown in FIG. 5B. Of course, it may also be any one of those as shown in FIGS. 5A, 5C and 5D, or any other photoelectric detection unit capable of achieving the purpose of the present disclosure, which will not be particularly defined herein. Identically, the filtration and amplification module 931 in FIG. 9 may be the filtration and amplification module as shown in FIG. 6B. It should be appreciated that, it may also be any one of those as shown in FIGS. 6A, 6C and 6D. The threshold comparison module 932 in FIG. 9 may be the threshold comparison module as shown in FIG. 7C. It should be appreciated that, it may also be any one of those as shown in FIGS. 7A, 7B and 7D, which will not be particularly defined herein. The optical flow information timing unit 950 in FIG. 9 may be the optical flow information timing unit as shown in FIG. 8A. It should be appreciated that, it may also be that as shown in FIG. 8B, which will not be particularly defined herein.

When the optical flow information detection process starts, the resetting signal may be valid, and a first switch $K_1$ of the filtration and amplification module 931 may be turned on. The second electric signal outputted by the filtration and amplification module 931 may be fixed at a reference potential, which is the same as a reference potential applied to an input positive pole of a second amplifier $A_2$ of the filtration and amplification module 931 and which has a value between a first threshold and a second threshold for the rear-end threshold comparison module 932. In this way, the optical flow information timing trigger unit 930 may not generate any optical flow information timing trigger signal. After the resetting signal has been canceled, the first switch $K_1$ may be turned off, and a first capacitor $C_1$ may sample the first electric signal outputted by the photoelectric detection unit 910 at a current time point as an initial reference level for the subsequent detection. The second electric signal may correspond to a difference between the first electric signal and the initial reference level in real time, and when the second electric signal exceeds a threshold detection range of the threshold comparison module 932, the optical flow information timing trigger signal may be generated. Here, a second capacitor $C_2$ and an adjustable resistor $R_3$ of the filtration and amplification module 931 may form a high-pass filter, so as to shield a low-frequency component in the first electric signal that changes slowly. In other words, although the second electric signal corresponds to the difference between the first electric signal and the initial reference level in real time, the initial reference level does not completely depend on the first electric signal when the first switch $K_1$ is turned off. When the first electric signal changes slowly (at a low frequency) after the first switch $K_1$ is turned off, the initial reference level may change slowly along with the first electric signal in real time, so as to effectively filter out the low-frequency component in the first electric signal. An OR logic unit (i.e., an OR gate) of the threshold comparison module 932 may perform an OR operation on outputs from the above-mentioned two comparison units, and transmit a result to the optical flow information timing control unit 940, so as to detect the changes in the light intensity in different directions (from strong to weak and from weak to strong).

The optical flow information timing control unit 940 may receive the timing trigger signal generated by the front-end optical flow information timing trigger unit 930, and generate the timing start signal for the rear-end optical flow information timing unit 950. As mentioned hereinabove, the optical flow information timing control unit 940 mainly consists of two parts, i.e., a latch and a pulse shaper. The front-end latch may be used to represent whether the pixel unit has been triggered in the optical flow information detection process, a resetting signal for the latch may be a global resetting signal, and a setting signal for the latch may be a local optical flow information timing trigger signal. Hence, when the optical flow information detection process starts and an active change in the light intensity for a pixel unit (caused by the movement) has been detected, the latch may be set in accordance with the optical flow information trigger signal. The latch cannot be reset automatically, so the latch may be maintained in a setting state until a next resetting signal is valid (i.e., a next optical flow information detection process starts). Hence, a time point when the latch is set may be just a time point when the active movement is initially detected by the current pixel unit in the optical flow information detection process. Although the optical flow information trigger unit may generate the timing trigger signal in response to the change in the light intensity subsequently, the latch has been set, so the timing trigger signal generated subsequently may be shielded. The pulse shaper may detect a latching signal from the latch, and generate a pulse signal as the timing start signal for the rear-end optical flow information timing unit 950 when the latch has been set. In this way, it is able to ensure that the pixel collection circuit merely responds to an initial change in the light intensity that meets the preset condition and the optical flow information timing unit 950 with a monotonous gain characteristic is started once in the optical flow information detection process. There are a definite mapping relationship between the space information about the triggered pixel units in the array and the space information about the moving object, and a definite mapping relationship between the time information from the optical flow information timing unit and the time information about the moving object, so it is able to acquire the time-mapping image in an active optical flow mode. For the optical flow information timing unit 950, a timing signal may be reset to a ground potential when the resetting signal is valid ($K_5$ is turned on), and rapidly pulled up to a power source voltage when the optical flow information timing unit 950 is started ($K_4$ is turned on), and then pulled down to the ground potential at a fixed slope. The magnitude information about the ramp signal may be read at different time points so as to acquire the time information about the triggering time point of the pixel unit.

The row selection output unit 960 is configured as two buffers with selective switches. The two buffers may be independent of each other, and configured to output the first electric signal from the image information collection unit 920 and the timing signal from the optical flow information timing unit 950 respectively. When the image output row selection line is valid, a selective switch coupled to a first electric signal line may be turned on, and the first electric signal from the image information collection unit 920 may be cached and then transmitted to the first electric signal line. When the optical flow output row selection line is valid, a selective switch coupled to a timing signal line may be turned on, and the timing signal from the optical flow information timing unit 950 may be cached and transmitted to the timing signal line.

Figure 10:
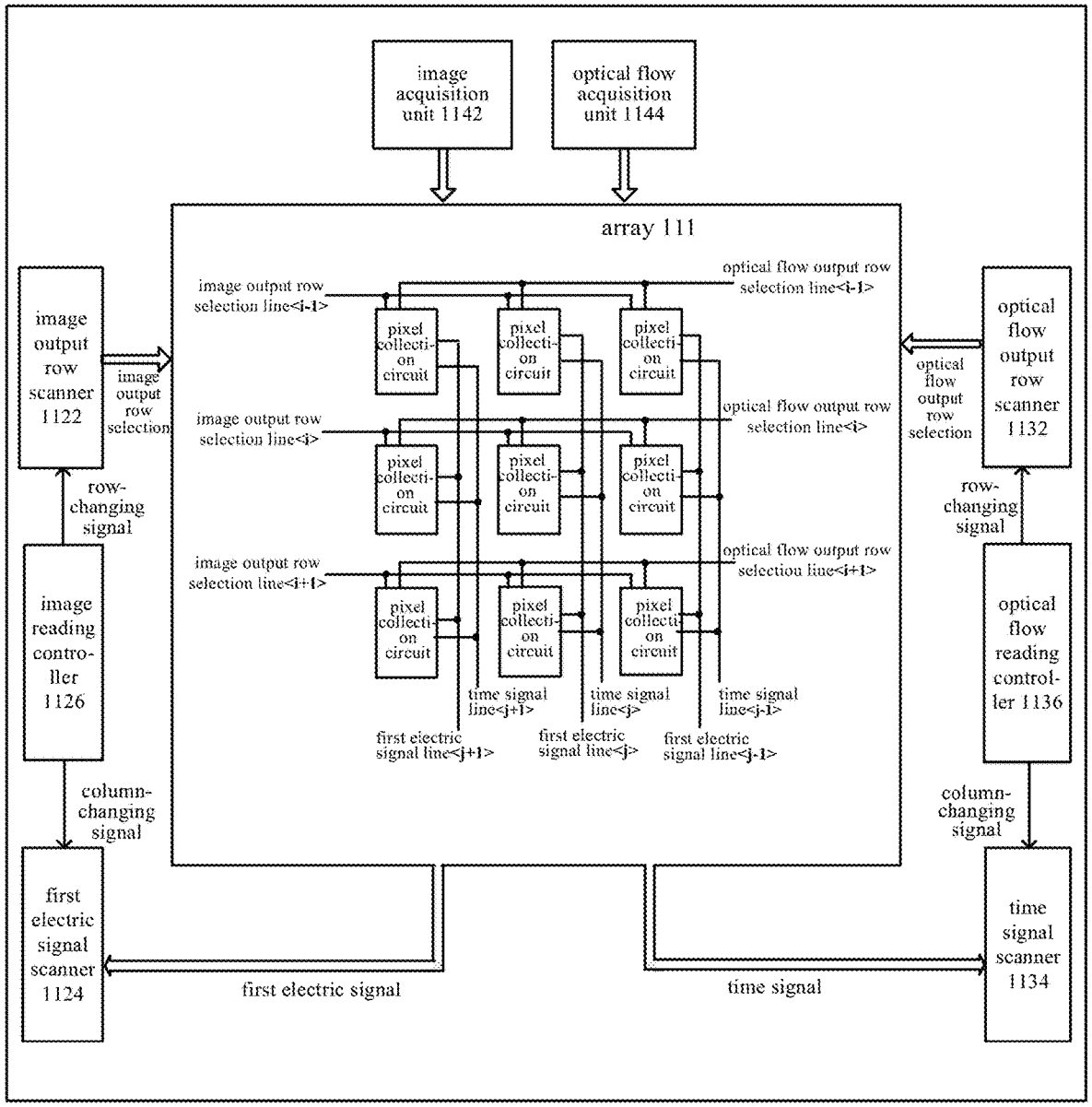
FIG. 10 is a schematic view showing the optical flow sensor 110 according to one embodiment of the present disclosure.

FIG. 10 shows the optical flow sensor 110. As shown in FIG. 10, the optical flow sensor 110 at least includes the pixel collection circuit array 111, the optical flow information reading unit 113 and the global control unit 114. Of course, in order to facilitate the collection of the image information, the optical flow sensor 110 may further include the image information reading unit 112.

In a possible embodiment of the present disclosure, the pixel collection circuit array 111 may include a plurality of pixel collection circuits 400. The description about the pixel collection circuit 400 may refer to that mentioned hereinabove and thus will not be particularly defined herein. The optical flow information reading unit 113 may read the timing signals from at least a part of the pixel collection circuits in the pixel collection circuit array 111. The global control unit 114 may generate the resetting signal, and output the resetting signal to each pixel collection circuit in the pixel collection circuit array 111 via the optical flow information resetting line. Identically, the image information reading unit 112 may read the first electric signals from at least a part of the pixel collection circuits in the pixel collection circuit array 111. The global control unit 114 may generate the image information collection signal, and output the image information collection signal to each pixel collection circuit in the pixel collection circuit array 111 via the image information collection line.

More specifically, the global control unit 114 may include the image acquisition module 1142 and the optical flow acquisition module 1144. The image acquisition module 1142 may be coupled to each pixel collection circuit in the pixel collection circuit array 111 via the image information collection line, and configured to control, at an initial stage for the image frame collection, the image information collection unit in the pixel array to acquire the first electric signal related to the light intensity at a current time point. The optical flow acquisition module 1144 may be coupled to each pixel collection circuit in the pixel collection circuit array 111 via the optical flow information resetting line, and configured to generate the resetting signal to reset all units/modules related to the optical flow information detection at an initial stage of the optical flow information detection process.

The optical flow information reading unit 113 may include an optical flow output row scanner 1132 (i.e., a row selection unit), a time signal scanner 1134 (i.e., a column selection unit) and an optical flow reading controller 1136. The optical flow output row scanner 1132 may be coupled to the pixel collection circuits in one row in the pixel collection circuit array via an optical flow output row selection line. The optical flow reading controller 1136 is configured to indicate the optical flow output row scanner 1132 to set the optical flow output row selection lines in the pixel collection circuit array as active one by one, and indicate the time signal scanner 1134 to read the timing signals from the pixel collection circuits in the row sequentially.

The image information reading unit 112 may include an image output row scanner 1122 (i.e., a row selection unit), a first electric signal scanner 1124 (i.e., a column selection unit) and an image reading controller 1126. The image output row scanner 1122 may be coupled to the pixel collection circuits in one row in the pixel collection circuit array via an image output row selection line. The image reading controller 1126 is configured to indicate the image output row scanner 1122 to set the image output row selection lines in the pixel collection circuit array as active one by one, and indicate the first electric signal scanner 1124 to read the first electric signals from the pixel collection circuits in the row sequentially.

FIG. 10 shows parts of the pixel collection circuits in the array 111. These pixel collection circuits may be arranged in an $(i-1)^{th}$ row, an $i^{th}$ row and an $(i+1)^{th}$ row (corresponding to the image/optical flow output row selection lines) and in a $(j-1)^{th}$ column, a $j^{th}$ column and a $(j+1)^{th}$ column (corresponding to the data output buses, i.e., the first electric signal lines and the time signal lines). However, the structure of the array 111 may not be limited thereto. The pixel collection circuits in each row in the pixel collection circuit array 111 (e.g., the $i^{th}$ row in FIG. 9) may be coupled to the image output row scanner 1122 via a corresponding image output row selection line, and coupled to the optical flow output row scanner 1132 via a corresponding optical flow output row selection line. The pixel collection circuits in each column in the pixel collection circuit array 111 may be coupled to the first electric signal scanner 1124 and the time signal scanner 1134 via a corresponding data line for transmitting the first electric signal and a corresponding data line for transmitting the time signal. The image output row scanner 1122 and the first electric signal scanner 1124 may, under the control of the image reading controller 1126, scan the first electric signals from the entire pixel collection circuit array 111 to acquire the image frame information. The optical flow output row scanner 1132 and the time signal scanner 1134 may, under the control of the optical flow reading controller 1136, the time signals from the entire pixel collection circuit array 111 to acquire the optical frame information.

In the embodiments of the present disclosure, the output of the image frame and the output of the optical frame may be controlled using a same principle. The following description will be given by taking the output of the image frame as an example. At first, the image reading controller 1126 may indicate the image output row scanner 1122 to select the pixel collection circuits in a first row, and the image output row scanner 1122 may set a first image output row selection line as active (the others may be inactive). The pixel collection circuits in the first row may transmit the collected first electric signals to the first electric signal scanner 1124 through the row selection output unit. Then, the image reading controller 1126 may control the first electric signal scanner 1124 to scan the first electric signals from the pixel collection circuits in the first row one by one. When the first electric signal has been outputted by the last pixel collection circuit in the first row, the image reading controller 1126 may transmit a row-changing signal to the image output row scanner 1122 to indicate the image output row scanner 1122 to skip to a second row, and control the first electric signal scanner 1124 to scan the first electric signals from the pixel collection circuits in the second row one by one. The similar operation may be performed until the first electric signals from all the pixel collection circuits in the array 111 have been read. An output mode of the optical flow information may be the same as that mentioned hereinabove, and the operations may be performed by the optical flow reading controller 1136, the optical flow output row scanner 1132 and the time signal scanner 1134.

In a word, according to the optical flow sensor 110 in the embodiments of the present disclosure, a scheme may be provided so as to extract the optical flow information about the objects moving at various speeds. In addition, the image information may be collected so as to acquire the clear, non-lagged grayscale image as the background information for the extracted optical flow information. The optical flow sensor 110 may output the optical frame information and the image frame information in parallel. Each optical flow may contain the space information about the triggered pixel collection circuits and the time information about the triggering time point of each triggered pixel collection circuit. The pixel unit with the time-space information may be directly associated with the movement of the object in the three-dimensional space, and through analyzing the aspect information and the gradient information about the time slope plane acquired through mapping the time information to the two-dimensional space of the pixel array, it is able to effectively extract the optical flow information about the movement. In addition, it does not need to take any exposure time for the acquisition of each image frame, and through such a control mechanism similar to global shutter, it is able to acquire the clear, non-lagged grayscale image even for the object moving at a high speed. The grayscale image may be used to provide background image for the extraction of the optical flow information from the optical frames, and applied to a conventional grayscale image-based processing algorithm.

The optical flow information timing unit in each pixel collection circuit may provide the time information about the triggering time point of each pixel unit, without any interference from the reading of the optical flow information. Through such a non-destructive reading mechanism, it is able to ensure the continuity of the output of the optical flow frames, i.e., to acquire the time information and the space information about all the triggered pixel units within a subsequent optical flow frame. Based on this characteristic, the optical flow sensor may detect the object moving at a high speed, and detect the object moving at a low or intermediate speed which is more common in actual use. More specifically, it needs to take a relatively long time for the object to move along the movement trajectory at a low speed, so an interval between the triggering time points of the pixel units in the field of view may be relatively long. Through the non-destructive reading mechanism, it is able to acquire the complete time-space information about the triggered pixel units for the optical flow analysis (corresponding to the movement trajectory in the field of view) within the optical flow frames outputted continuously.

In addition, the optical flow sensor 110 may acquire the optical flow information and the image information independently, and output the optical flow information and the image information in parallel without mutual interference. Further, it is able to adjust a collection speed and a reading speed of each of the optical flow information and the image information according to the practical need.

It should be appreciated that, although with a large number of details, these specific details are not necessary for the implementation of the present disclosure. In some embodiments of the present disclosure, the known method, structure or technology is not shown, so as to facilitate the understanding of the present disclosure in a better manner.

It should be further appreciated that, sometimes the features of the present disclosure are described in conjunction with a single embodiment or figure, so as to facilitate the understanding of one or more aspects of the present disclosure. However, the method in the present disclosure shall not be construed as to reflect the intention that the present disclosure asks for more features than those specified in each claims. More definitely, as reflected in the appended claims, the creative aspect lies in the features less than all the features in the above-mentioned single embodiment. Hence, each claim following a specific embodiment may be definitely incorporated into the specific embodiment, and each claim itself may serve as an individual embodiment of the present disclosure.

It should be further appreciated that, modules, units or components in the above examples may be arranged in the device described in the embodiments, or in one or more devices different from the device. The modules may be combined into one module, or each module may be divided into a plurality of submodules.

It should be further appreciated that, the modules may be modified adaptively and arranged in one or more devices different from that mentioned hereinabove. The modules, units or components may be combined into one module, unit or component, or each module, unit or component may be divided into a plurality of submodules, subunits or subcomponents. Apart from the features, processes or units conflicting with each other, all the features, processes or units involved in the specification (including the appended claims, abstract and drawings) may be combined in any form. Unless otherwise defined, each feature in the specification (including the appended claims, abstract and drawings) may be replaced with a same, equivalent or similar feature.

The followings are also provided in the embodiments of the present disclosure.

- A8. The pixel collection circuit according to A1, wherein the photoelectric detection unit includes a photodiode ($PD_1$) whose anode is grounded and N transistors connected to each other in series, wherein N≥2, a source electrode of a first transistor is coupled to a cathode of the photodiode ($PD_1$), a drain electrode of an $N^{th}$ transistor is coupled to a power source (VDD), a gate electrode of each transistor is coupled to a drain electrode of the transistor, and a source electrode of each of second to the $N^{th}$ transistors is coupled to a drain electrode of a previous transistor.
- A9. The pixel collection circuit according to A1, wherein the photoelectric detection unit includes: a photodiode ($PD_1$) whose anode is grounded; N transistors connected to each other in series, N≥2, a source electrode of a first transistor being coupled to a cathode of the photodiode ($PD_1$), a drain electrode of an $N^{th}$ transistor being coupled to a power source (VDD), a source electrode of each of second to the $N^{th}$ transistors being coupled to a drain electrode of a previous transistor, and a gate electrode of each of the second to the $N^{th}$ transistors being coupled to a drain electrode of a previous transistor; and a first amplifier ($A_1$) coupled between the cathode of the photodiode ($PD_1$) and a gate electrode of the first transistor.
- A10. The pixel collection circuit according to A4, wherein the filtration and amplification module includes: a second amplifier ($A_2$), a positive pole of which is coupled to an output terminal of the photoelectric detection unit, and a negative pole of which is coupled to a pull-down first resistor ($R_1$), a second resistor ($R_2$) being coupled between an output terminal and the negative pole of the second amplifier ($A_2$), the second amplifier being configured to amplify a first electric signal from the photoelectric detection unit; and a high-pass filter coupled to the second amplifier ($A_2$) and configured to filter out a signal component in the amplified first electric signal whose frequency is smaller than a frequency threshold, thereby to output a second electric signal.
- A11. The pixel collection circuit according to A4, wherein the filtration and amplification module includes: a first capacitor ($C_1$), a first terminal of which is coupled to an output terminal of the photoelectric detection unit; a second amplifier ($A_2$), a positive pole of which is coupled to a terminal at a fixed potential, and a negative pole of which is coupled to a second terminal of the first capacitor ($C_1$); and a second capacitor ($C_2$), a third resistor ($R_3$) and a first switch ($K_1$) connected in parallel between the negative pole and an output terminal of the second amplifier ($A_2$), wherein when a resetting signal is valid, the first switch ($K_1$) is turned on, and when the resetting signal has been canceled, the first switch ($K_1$) is turned off.
- A12. The pixel collection circuit according to A11, wherein the third resistor is an adjustable resistor.
- A13. The pixel collection circuit according to A4, wherein the filtration and amplification module includes: a second amplifier ($A_2$), a positive pole of which is coupled to an output terminal of the photoelectric detection unit; a first capacitor ($C_1$), a first terminal of which is coupled to a negative pole of the second amplifier ($A_2$), and a second terminal of which is coupled to a terminal at a fixed potential; a first switch ($K_1$) connected between the first terminal of the first capacitor ($C_1$) and the output terminal of the photoelectric detection unit; and a high-pass filter coupled to the second amplifier ($A_2$) and configured to filter out a signal component in the amplified first electric signal whose frequency is smaller than a predetermined frequency threshold, thereby to generate a second electric signal, wherein when a resetting signal is valid, the first switch ($K_1$) is turned on, and when the resetting signal has been canceled, the first switch ($K_1$) is turned off.
- A14. The pixel collection circuit according to A4, wherein the filtration and amplification module includes: a first capacitor ($C_1$), a first terminal of which is coupled to an output terminal of the photoelectric detection unit; a current replicator ($P_1$), a first terminal of which is coupled to a second terminal of the first capacitor ($C_1$); a second amplifier ($A_2$), a positive pole of which is coupled to a terminal at a fixed potential, and a negative pole of which is coupled to a second terminal of the current replicator ($P_1$); and a second capacitor ($C_2$), a third resistor ($R_3$) and a first switch ($K_1$) connected in parallel between the negative pole and an output terminal of the second amplifier ($A_2$), wherein when a resetting signal is valid, the first switch ($K_1$) is turned on, and when the resetting signal has been canceled, the first switch ($K_1$) is turned off.
- A15. The pixel collection circuit according to A4, wherein the threshold comparison module includes a first voltage comparator ($VC_1$), a reverse-phase input terminal of which is coupled to a signal line for providing the first threshold, and an in-phase input terminal of which is coupled to an output terminal of the filtration and amplification module.

A16. The pixel collection circuit according to A4, wherein the threshold comparison module includes a second voltage comparator ($VC_2$), an in-phase input terminal of which is coupled to a signal line for providing the second threshold, and a reverse-phase input terminal of which is coupled to an output terminal of the filtration and amplification module.

A17. The pixel collection circuit according to A4, wherein the threshold comparison module includes: a first voltage comparator ($VC_1$), a reverse-phase input terminal of which is coupled to a signal line for providing the first threshold, and an in-phase input terminal of which is coupled to an output terminal of the filtration and amplification module; a second voltage comparator ($VC_2$), an in-phase input terminal of which is coupled to a signal line for providing the second threshold, and a reverse-phase input terminal of which is coupled to the output terminal of the filtration and amplification module; and an OR gate, a first input terminal of which is coupled to an output terminal of the first voltage comparator, a second input terminal of which is coupled to an output terminal of the second voltage comparator, and which is configured to perform an OR operation on an output from the first voltage comparator and an output from the second voltage comparator.

A18. The pixel collection circuit according to A4, wherein the threshold comparison module includes: a voltage difference comparator ($VD_1$), a first input terminal of which is coupled to a pull-down third capacitor ($C_3$), a second input terminal of which is coupled to a pull-down fourth capacitor ($C_4$), and which is configured to output a differential signal between the first input terminal and the second input terminal; a second switch ($K_2$) arranged between the third capacitor ($C_3$) and an output terminal of the filtration and amplification module; a first buffer ($B_1$) and a third switch ($K_3$) connected in series between the third capacitor ($C_3$) and the fourth capacitor ($C_4$); a first voltage comparator ($VC_1$), a reverse-phase input terminal of which is coupled to a signal line for providing the first threshold, and an in-phase input terminal of which is coupled to an output terminal of the voltage difference comparator; a second voltage comparator ($VC_2$), an in-phase input terminal of which is coupled to a signal line for providing the second threshold, and a reverse-phase input terminal of which is coupled to the output terminal of the voltage difference comparator; and an OR gate, a first input terminal of which is coupled to an output terminal of the first voltage comparator, a second input terminal of which is coupled to an output terminal of the second voltage comparator, and an output terminal of which is coupled to the third switch ($K_3$), wherein when the differential signal from the voltage difference comparator is greater than the first threshold or smaller than the second threshold, the threshold comparison module is configured to output an optical flow information timing trigger signal, and turn off the second switch ($K_2$), turn on the third switch ($K_3$), turn off the third switch ($K_3$) and turn on the second switch ($K_2$) sequentially.

A19. The pixel collection circuit according to A1, wherein the optical flow information timing unit includes: a fifth switch ($K_5$), a fifth capacitor ($C_5$) and a third transistor ($T_3$) connected in parallel between a fourth switch ($K_4$) and a terminal at a fixed potential; and the fourth switch ($K_4$), a first terminal of which is coupled to the fifth switch ($K_5$), the fifth capacitor ($C_5$) and the third transistor ($T_3$), and a second terminal of which is coupled to another terminal at a fixed potential, wherein when the resetting signal is valid, the fifth switch ($K_5$) is turned on.

A20. The pixel collection circuit according to A1, wherein the optical flow information timing unit includes: a fifth switch ($K_5$), a fifth capacitor ($C_5$) and a fourth resistor ($R_4$) connected in parallel between a fourth switch ($K_4$) and a terminal at a fixed potential; and the fourth switch ($K_4$), a first terminal of which is coupled to the fifth switch ($K_5$), the fifth capacitor ($C_5$) and the fourth resistor ($R_4$), and a second terminal of which is coupled to another terminal at a fixed potential, wherein when the resetting signal is valid, the fifth switch ($K_5$) is turned on.

B23. The optical flow sensor according to B21 or B22, wherein the optical flow information reading unit includes: an optical flow output row scanner coupled to the pixel collection circuits in one row in the pixel collection circuit array via an optical flow output row selection line; a time signal scanner; and an optical flow reading controller configured to indicate the optical flow output row scanner to set the optical flow output row selection lines in the pixel collection circuit array as active one by one, and indicate the time signal scanner to read the timing signals from the pixel collection circuits in the row sequentially.

B24. The optical flow sensor according to B22, wherein the image information reading unit includes: an image output row scanner coupled to the pixel collection circuits in one row in the pixel collection circuit array via one image output row selection line; a first electric signal scanner; and an image reading controller configured to indicate the image output row scanner to set the image output row selection lines in the pixel collection circuit array as active one by one, and indicate the first electric signal scanner to read the first electric signals from the pixel collection circuits in the row sequentially.

B25. The optical flow sensor according to B24, wherein the global control unit includes an optical flow acquisition module couple to each pixel collection circuit in the pixel collection circuit array via an optical flow information resetting line and configured to generate the resetting signal.

B26. The optical flow sensor according to B24, wherein the global control unit further includes an image acquisition module coupled to each pixel collection circuit in the pixel collection circuit array via an image information collection line, and configured to generate the image information collection signal.

In addition, it should be appreciated that, although some embodiments include some features in the other embodiments, the combination of the features in different embodiments may also fall within the scope of the present disclosure. For example, the features in the appended claims may be combined in any form.

In addition, some of the embodiments have been described as a combination of methods or method elements capable of being implemented by a processor of a computer system or any other device. Hence, the processor including necessary instructions for implementing the methods or the method elements may be used to form a device for implementing the methods or the method elements.

Unless otherwise defined, such ordinal numerals as "first", "second" and "third" are merely used to differentiate different components rather than to represent any order, number or importance.

Although with the above embodiments, a person skilled in the art may obtain the other embodiments, which also fall within the scope of the present disclosure. In addition, it should be appreciated that, the words are selected in the present disclosure principally for readability and guidance, but shall not be construed as limiting the scope of the present disclosure. Obviously, a person skilled in the art may make further modifications and improvements without departing from the spirit of the present disclosure. The above description is for illustrative but not restrictive purposes, and the scope of the present disclosure shall be subject to the appended claims.

What is claimed is:

1. A pixel collection circuit, comprising:
a photoelectric detection unit configured to output a first electric signal representing an intensity of a received optical signal in real time;
an optical flow information timing trigger unit, a first input terminal of which is coupled to an output terminal of the photoelectric detection unit, and a second input terminal of which is coupled to an optical flow information resetting line, and which is configured to output an optical flow information timing trigger signal after a resetting signal from the optical flow information resetting line has been canceled and the first electric signal has met a preset trigger condition;
an optical flow information timing control unit, a first input terminal of which is coupled to the optical flow information timing trigger unit, and a second input terminal of which is coupled to the optical flow information resetting line, and which is configured to output a timing start signal after the resetting signal from the optical flow information resetting line has been canceled and the optical flow information timing trigger signal has been received;
an optical flow information timing unit, a first input terminal of which is coupled to the optical flow information timing control unit, and a second input terminal of which is coupled to the optical flow information resetting line, and which is configured to be started and generate a timing signal after the resetting signal from the optical flow information resetting line has been canceled and the timing start signal has been received; and
a row selection output unit, a first input terminal of which is coupled to the optical flow information timing unit, and a second input terminal of which is coupled to an optical flow output row selection line, and which is configured to receive an optical flow row selection signal from the optical flow output row selection line, and cache and output the timing signal at a current reception time point when the optical flow row selection signal is valid.

2. The pixel collection circuit according to claim 1, further comprising an image information collection unit, a first input terminal of which is coupled to the output terminal of the photoelectric detection unit, a second input terminal of which is coupled to an image information collection line, and which is configured to receive an image information collection signal from the image information collection line, and sample and cache the first electric signal at the current reception time point, wherein a third input terminal of the row selection output unit is coupled to the image information collection unit, and a fourth input terminal of the row selection output unit is coupled to an image output row selection line, so as to receive an image row selection signal from the image output row selection line, and cache and output the first electric signal at the current reception time point when the image row selection signal is valid.

3. The image collection circuit according to claim 2, wherein the image information collection unit is further configured to sample the first electric signal at the current reception time point when the received image information collection signal is valid, and cache the sampled first electric signal when the received image information collection signal is invalid.

4. The pixel collection circuit according to claim 3, wherein the optical flow information timing trigger unit comprises: a filtration and amplification module configured to perform a preprocessing operation on the first electric signal to generate a second electric signal, the preprocessing operation comprises at least one of an amplification operation and a filtration operation; and a threshold comparison module configured to determine whether the second electric signal is greater than a first threshold and/or whether the second electric signal is smaller than a second threshold, and when the second electric signal is greater than the first threshold or smaller than the second threshold, generate the optical flow information timing trigger signal.

5. The pixel collection circuit according to claim 4, wherein the optical flow information timing control unit comprises: a latch configured to be reset when the resetting signal is valid and to be set when the optical flow information timing trigger signal has been received initially; and a pulse shaper configured to generate the timing start signal when the latch has been set.

6. The pixel collection circuit according to claim 5, wherein the photoelectric detection unit comprises: a photodiode ($PD_1$) whose anode is grounded; and a first transistor ($T_1$), a source electrode of which is coupled to a cathode of the photodiode ($PD_1$), and a drain electrode and a gate electrode of which are coupled to a power source (VDD).

7. The pixel collection circuit according to claim 5, wherein the photoelectric detection unit comprises: a photodiode ($PD_1$) whose anode is grounded; a first transistor ($T_1$), a source electrode of which is coupled to a cathode of the photodiode ($PD_1$), and a drain electrode of which is coupled to a power source (VDD); and a first amplifier ($A_1$) coupled between the cathode of the photodiode ($PD_1$) and a gate electrode of the first transistor ($T_1$).

8. The pixel collection circuit according to claim 7, wherein the filtration and amplification module comprises: a second amplifier ($A_2$), a positive pole of which is coupled to the output terminal of the photoelectric detection unit, a negative pole of which is coupled to a pull-down first resistor ($R_1$), a second resistor ($R_2$) being coupled between an output terminal and the negative pole of the second amplifier ($A_2$), the second amplifier ($A_2$) being configured to amplify the first electric signal from the photoelectric detection unit; and a high-pass filter coupled to the second amplifier ($A_2$) and configured to filter out a signal component in the amplified first electric signal whose frequency is smaller than a frequency threshold, so as to output the second electric signal.

9. The pixel collection circuit according to claim 7, wherein the filtration and amplification module comprises: a first capacitor ($C_1$), a first terminal of which is coupled to the output terminal of the photoelectric detection unit; a second amplifier ($A_2$), a positive pole of which is coupled to a terminal at a fixed potential, and a negative pole of which is coupled to a second terminal of the first capacitor ($C_1$); and a second capacitor ($C_2$), a third resistor ($R_3$) and a first switch ($K_1$) connected in parallel between the negative pole and an output terminal of the second amplifier ($A_2$), wherein the first switch ($K_1$) is turned on when the resetting signal is valid, and turned off when the resetting signal has been canceled.

10. The pixel collection circuit according to claim 9, wherein the threshold comparison module comprises: a first voltage comparator ($VC_1$), a reverse-phase input terminal of which is coupled to a signal line for providing the first threshold, and an in-phase input terminal of which is coupled to an output terminal of the filtration and amplification module; a second voltage comparator ($VC_2$), an in-phase input terminal of which is coupled to a signal line for providing the second threshold, and a reverse-phase input terminal of which is coupled to the output terminal of the filtration and amplification module; and an OR gate, a first input terminal of which is coupled to an output terminal of the first voltage comparator, a second input terminal of which is coupled to an output terminal of the second voltage comparator, and which is configured to perform an OR operation on an output from the first voltage comparator and an output from the second voltage comparator.

11. The pixel collection circuit according to claim 9, wherein the threshold comparison module comprises: a voltage difference comparator ($VD_1$), a first input terminal of which is coupled to a pull-down third capacitor ($C_3$), a second input terminal of which is coupled to a pull-down fourth capacitor ($C_4$), and which is configured to output a differential signal between the first input terminal and the second input terminal; a second switch ($K_2$) arranged between the third capacitor ($C_3$) and the output terminal of the filtration and amplification module; a first buffer ($B_1$) and a third switch ($K_3$) connected in series between the third capacitor ($C_3$) and the fourth capacitor ($C_4$); a first voltage comparator ($VC_1$), a reverse-phase input terminal of which is coupled to a signal line for providing the first threshold, and an in-phase input terminal of which is coupled to an output terminal of the voltage difference comparator; a second voltage comparator ($VC_2$), an in-phase input terminal of which is coupled to a signal line for providing the second threshold, and a reverse-phase input terminal of which is coupled to the output terminal of the voltage difference comparator; and an OR gate, a first input terminal of which is coupled to an output terminal of the first voltage comparator, a second input terminal of which is coupled to an output terminal of the second voltage comparator, and an output terminal of which is coupled to the third switch ($K_3$), wherein when the differential signal from the voltage difference comparator is greater than the first threshold or smaller than the second threshold, the threshold comparison module is configured to output the optical flow information timing trigger signal, and turn off the second switch ($K_2$), turn on the third switch ($K_3$), turn off the third switch ($K_3$) and turn on the second switch ($K_2$) sequentially.

12. The pixel collection circuit according to claim 11, wherein the optical flow information timing unit comprises: a fifth switch ($K_5$), a fifth capacitor ($C_5$) and a third transistor ($T_3$) connected in parallel between a fourth switch ($K_4$) and a terminal at a fixed potential; and the fourth switch ($K_4$), a first terminal of which is coupled to the fifth switch ($K_5$), the fifth capacitor ($C_5$) and the third transistor ($T_3$), and a second terminal of which is coupled to another terminal at a fixed potential, wherein when the resetting signal is valid, the fifth switch ($K_5$) is turned on.

13. The pixel collection circuit according to claim 11, wherein the optical flow information timing unit comprises: a fifth switch ($K_5$), a fifth capacitor ($C_5$) and a fourth resistor ($R_4$) connected in parallel between a fourth switch ($K_4$) and a terminal at a fixed potential; and the fourth switch ($K_4$), a first terminal of which is coupled to the fifth switch ($K_5$), the fifth capacitor ($C_5$) and the fourth resistor ($R_4$), and a second terminal of which is coupled to anther terminal at a fixed potential, wherein when the resetting signal is valid, the fifth switch ($K_5$) is turned on.

14. An optical flow sensor, comprising:
a pixel collection circuit array comprising a plurality of the pixel collection circuits according to claim 13;
an optical flow information reading unit configured to read timing signals outputted by at least a part of the pixel collection circuits in the pixel collection circuit array; and
a global control unit configured to generate a resetting signal, and output the resetting signal to each pixel collection circuit in the pixel collection circuit array through an optical flow information resetting line.

15. The optical flow sensor according to claim 14, further comprising an image information reading unit configured to read first electric signals outputted by at least a part of the pixel collection circuits in the pixel collection circuit array, wherein the global control unit is further configured to generate an image information collection signal, and output the image information collection signal to each pixel collection circuit in the pixel collection circuit array through an image information collection line.

16. The optical flow sensor according to claim 15, wherein the optical flow information reading unit comprises: an optical flow output row scanner coupled to the pixel collection circuits in one row in the pixel collection circuit array through an optical flow output row selection line; a time signal scanner; and an optical flow reading controller configured to indicate the optical flow output row scanner to set the optical flow output row selection lines in the pixel collection circuit array as active one by one, and indicate the time signal scanner to read timing signals outputted by the pixel collection circuits in the row sequentially.

17. The optical flow sensor according to claim 15, wherein the image information reading unit comprises: an image output row scanner coupled to the pixel collection circuits in one row in the pixel collection circuit array through one image output row selection line; a first electric signal scanner; and an image reading controller configured to indicate the image output row scanner to set the image output row selection lines in the pixel collection circuit array one by one, and indicate the first electric signal scanner to read the first electric signals outputted by the pixel collection circuits in the row sequentially.

18. The optical flow sensor according to claim 17, wherein the global control unit comprises an optical flow acquisition module coupled to each pixel collection circuit in the pixel collection circuit array through the optical flow information resetting line.

19. The optical flow sensor according to claim 18, wherein the global control unit further comprises an image acquisition module coupled to each pixel collection circuit in the pixel collection circuit array through the image information collection line and configured to generate the image information collection signal.

20. An optical flow and image information collection system, comprising: the optical flow sensor according to claim 19; an optical flow preprocessor coupled to the optical flow information reading unit in the optical flow sensor, and configured to acquire a timing signal and generate a time-mapping image of each triggered pixel point; and an image preprocessor coupled to the image information reading unit in the optical flow sensor, and configured to acquire a first electric signal and generate a grayscale image of all pixel points.

* * * * *